(12) United States Patent
Isozaki et al.

(10) Patent No.: US 9,096,954 B2
(45) Date of Patent: *Aug. 4, 2015

(54) METAL NANOPARTICLE ARRAY STRUCTURE, DEVICE FOR PRODUCING SAME, AND METHOD FOR PRODUCING SAME

(75) Inventors: Katsuhiro Isozaki, Ibaraki (JP); Kazushi Miki, Ibaraki (JP); Takao Ochiai, Ibaraki (JP); Tomoya Taguchi, Ibaraki (JP); Kohichi Nittoh, Ibaraki (JP)

(73) Assignee: NATIONAL INSTITUTE FOR MATERIALS SCIENCE, Ibaraki (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/643,653

(22) PCT Filed: Mar. 3, 2011

(86) PCT No.: PCT/JP2011/054965
§ 371 (c)(1),
(2), (4) Date: Dec. 18, 2012

(87) PCT Pub. No.: WO2011/135924
PCT Pub. Date: Nov. 3, 2011

(65) Prior Publication Data
US 2013/0090264 A1    Apr. 11, 2013

(30) Foreign Application Priority Data

Apr. 27, 2010    (JP) ................. 2010-101980

(51) Int. Cl.
*C40B 40/00*    (2006.01)
*C40B 50/18*    (2006.01)
(Continued)

(52) U.S. Cl.
CPC .............. *C40B 50/18* (2013.01); *B01J 23/52* (2013.01); *B01J 35/006* (2013.01);
(Continued)

(58) Field of Classification Search
CPC ........ B82Y 30/00; C40B 40/00; C40B 40/18; C40B 50/18; C40B 60/14
USPC ............... 506/13, 22, 32, 40; 977/773
See application file for complete search history.

(56) References Cited

U.S. PATENT DOCUMENTS 6,755,953 B2 *    6/2004    Baba .................. 205/74

FOREIGN PATENT DOCUMENTS

JP    11-70358    3/1999
JP    2003-89896    3/2003
(Continued)

OTHER PUBLICATIONS

Zin et al., "Arrays of Covalently Bonded Single Gold Nanoparticles on Thiolated Molecular Assemblies," Langmuir 2006, 22:6346-6351.*

(Continued)

*Primary Examiner* — Samuel Woolwine
*Assistant Examiner* — Kaijiang Zhang
(74) *Attorney, Agent, or Firm* — Wenderoth, Lind & Ponack, L.L.P.

(57) ABSTRACT

An object of the invention is to provide a metal nanoparticle array structure in which metal nanoparticle arrays are firmly bonded to the substrate thereof via chemical bonding or the like and in which the coverage with the metal nanoparticle arrays is high.

The problem can be solved by using a metal nanoparticle array structure 10 that comprises a substrate 1, a immobilizing layer 2 formed on one surface 1a of the substrate 1, and metal nanoparticle arrays 3 formed on one surface 2a of the immobilizing layer 2, wherein the metal nanoparticle arrays 3 are so arrayed that multiple metal nanoparticles 4 can be at regular intervals and the metal nanoparticles 4 are bonded to each other via the modifying part 5 arranged on a surface thereof while the metal nanoparticles 4 are immobilized on one surface 2a of the immobilizing layer 2 via chemical bonds.

9 Claims, 15 Drawing Sheets

(51) Int. Cl.
*B82Y 30/00* (2011.01)
*B01J 23/52* (2006.01)
*B01J 35/00* (2006.01)
*B01J 37/34* (2006.01)
*B81C 1/00* (2006.01)
*C25D 13/02* (2006.01)
*C25D 13/22* (2006.01)

(52) U.S. Cl.
CPC ........... *B01J 35/0013* (2013.01); *B01J 37/342* (2013.01); *B81C 1/00031* (2013.01); *C25D 13/02* (2013.01); *C25D 13/22* (2013.01); *B81C 2201/0149* (2013.01); *B82Y 30/00* (2013.01); *C40B 40/00* (2013.01)

(56) References Cited

FOREIGN PATENT DOCUMENTS

| JP | 2003-282626 | 10/2003 |
|----|-------------|---------|
| JP | 2004-269922 | 9/2004 |
| JP | 2007-169669 | 7/2007 |
| JP | 2008-57011 | 3/2008 |
| JP | 2010-126735 | 6/2010 |
| JP | 2010-242136 | 10/2010 |

OTHER PUBLICATIONS

Qi et al., "Micropatterned Film of Silica-coated Gold Nanoparticles Formed by Covalent Bonds," Chem. Letts. 2007, 36:686-687.*

Gupta et al., Gold Nanoparticles Immobilized on Stimuli Responsive Polymer Brushes as Nanosensors, Macromolecules 2008, 41:8152-8158.*

Azzam et al., "Fabrication of a surface plasmon resonance biosensor based on gold nanoparticles chemisorbed onto a 1,10-decanedithiol self-assembled monolayer," Thin Solid Film 2009, 518:387-391, published online Jul. 16, 2009.*

International Search Report issued May 17, 2011 in International (PCT) Application No. PCT/JP2011/054965.

* cited by examiner (a)

(b)

(a)　　　　　　(b)　　　　　　(c)

(a)　　　　　(b)　　　　　(c)

| Alcohol | Yield [%] |
|---|---|
| Ethanol | 65.2 |
| 1-Butanol | 85.9 |
| 1-Hexanol | 37.6 |
| 2-Butanol | 50.3 |
| Tert-butanol | 2.32 |
| Benzyl Alcohol | 31.2 |

| Hydrosilane | Reaction Time [hr] | Yield [%] |
|---|---|---|
| Triphenylsilane | 10 | 95.5 |
| Diphenylmethylsilane | 10 | 91.4 |
| Dimethylphenylsilane | 2 | 99.8 |
| Trihexylsilane | 10 | 63.6 |
| Triethylsilane | 10 | 24.9 |
| Triisopropylsilane | 10 | 0.93 |
| Tristrimethylsiloxysilane | 10 | 0 |

| Temperature [°C] | Yield [%] |
|---|---|
| 15 | 58.1 |
| 25 | 85.9 |
| 30 | 74.2 |
| 35 | 80.5 |
| 45 | 85.8 |
| 60 | 88.2 |

METAL NANOPARTICLE ARRAY STRUCTURE, DEVICE FOR PRODUCING SAME, AND METHOD FOR PRODUCING SAME

TECHNICAL FIELD

The present invention relates to a metal nanoparticle array structure, and to a production apparatus and a production method for the metal nanoparticle array structure.

BACKGROUND ART

Integrating a nanoscale-size material realizes expression of a novel function. Therefore, integration techniques and integrated structures are now remarkable techniques and materials.

For example, metal nanoparticles having a particle size of from 1 to 100 nm can generate local light (hereinafter, near-field light) of which the size correspond to the radius of the particle. Accordingly, a metal nanoparticle array structure where metal nanoarrays are two-dimensionally arrayed on a substrate in such a manner that the distance between the metal nanoparticles could be from 1 to 10 nm can generate a large electric field or an extremely high-intensity near-field light in the gaps between the metal nanoparticles.

The metal nanoparticle array structure is expected to be applicable to optical waveguides, photochemical reactors, optical devices, high-sensitivity sensors and catalysts. For these applications, it is necessary to use a metal nanoparticle array structure where the size and the shape of the metal nanoparticles and also the distance between the metal nanoparticles are well uniformly controlled, for which, therefore, well controlling the size and the shape of the metal nanoparticles and also the distance between the metal nanoparticles will be a technical key point.

Some reports have already been made relating to the technique of producing a metal nanoparticle array structure. For example, nanosphere lithography (Non-Patent References 1 to 3) and electron beam lithography (Non-Patent Reference 4) are already-existing techniques, which, however, have some problems in that the lithography apparatus is expensive and a large-scale structure is difficult to produce.

Production according to a self-organizing method has been tried. As a method of using an external pressure, there are known a Langmuir method (Non-Patent References 5 to 8), a Langmuir-Blodgett method (Non-Patent References 9 to 10), a dip coating method (Non-Patent Reference 11), use of solid-liquid interface (Patent Reference 1). As a method of using an external field, there are known an electrophoresis method (Non-Patent Reference 13, Patent Reference 3), and a solvent evaporation method (Non-Patent Reference 12, Patent Reference 2). However, these methods do not have any strong immobilizing means such as chemical bond or the like between the metal nanoparticle array structure and the immobilizing substrate, and are therefore problematic in that the metal nanoparticle array structure would readily peel away from the immobilizing substrate.

Regarding the technique of note for fixation on a substrate such as chemical bond or the like, there are known a thiol bond (Non-Patent References 14 to 15), a CN bond (Non-Patent Reference 16), and a coordination bond (Non-Patent References 17 to 18). According to these methods, however, a metal nanoparticle array structure having a high coverage is not obtained.

The coverage means the proportion of the area occupied by the metal nanoparticle array structure within a specific area. Accordingly, at present, a metal nanoparticle array structure, in which the size and the shape of the metal nanoparticles and also the distance between the metal nanoparticles are well uniformly controlled and which is firmly immobilized on a substrate via chemical bond or the like and has a high coverage, is not as yet attained technically.

Patent Reference 1: JP-A 2006-192398
Patent Reference 2: JP-A 2007-313642
Patent Reference 3: JP-A 2009-6311
Non-Patent Reference 1: Wang, W.; Wang, Y.; Dai, Z.; Sun, Y.; Sun, Y. Appl. Surface Sci. 2007, 253, 4673-4676.
Non-Patent Reference 2: Shen, H.; Cheng, B.; Lu, G.; Ning, T.; Guan, D.; Zhou, Y.; Chen, Z., Nanotechnology, 2006, 17, 4274-4277.
Non-Patent Reference 3: Tan, B. J. Y.; Sow, C. H.; Koh, T. S.; Chin, K. C.; Wee, A. T. S.; Ong, C. K., J. Phys. Chem. B 2005, 109, 11100-11109.
Non-Patent Reference 4: Felidj, N.; Aubard, J.; Levi, G. Appl. Phys. Chem. 2003, 82, 3095-3097.
Non-Patent Reference 5: Liao, J; Agustsson, J. S.; Wu, S.; Schoenenberger, C.; Calame, M.; Leroux, Y.; Mayor, M.; Jeannin, O.; Ran, Y.-F.; Liu, S.-X.; Decurtins, S. Nano Lett. 2010, 10, 759-764.
Non-Patent Reference 6: Chiang, Y.-L; Chen, C.-W; Wang, C.-H.; Hsein, C.-Y; Chen, Y.-T; Appl, Phys. Lett., 2010, 96, 041904-1-041904-4.
Non-Patent Reference 7: Kim, B.; Tripp, S. L.; Wei, A. J. Am. Chem. Soc. 2001, 123, 7955-7956.
Non-Patent Reference 8: Kim, B.; Sadtler, B.; Tripp, S. L. Chem. Phys. Chem., 2001, 12, 743-745.
Non-Patent Reference 9: Park, Y.-K.; Yoo, S.-H.; Park, S. Langmuir, 2008, 24, 4370-4375.
Non-Patent Reference 10: Brown, J. J.; Porter, J. A.; Daghlian, C. P.; Gibson, U. J. Langmuir, 2001, 17, 7966-7969.
Non-Patent Reference 11: Dai, C.-A.; Wu, Y.-L.; Lee, Y.-H.; Chang, C.-J.; Su, W.-F. J. Cryst. Growth, 2006, 288, 128-136.
Non-Patent Reference 12: Wang, H.; Levin, C. S.; Hales, N. J. J. Am. Chem. Soc., 2005, 127, 14992-14993.
Non-Patent Reference 13: Peng, Z.; Qu, X.; Dong, S. Langmuir, 2004, 20, 5-10.
Non-Patent Reference 14: Kaminska, A.; Inya-Agha, O.; Forster, R. J.; Keyes, T. E. Phys. Chem. Chem. Phys., 2008, 10, 4172-4180.
Non-Patent Reference 15: Grabar, K. C.; Smith, P. C.; Musick, M. D.; Davis, J. A.; Walter, D. G.; Jackson, M. A.; Guthrie, A. P.; Natan, M. J. J. Am. Chem. Soc., 1996, 118, 1148-1153.
Non-Patent Reference 16: Chan, E. W. L.; Yu, L. Langmuir, 2002, 18, 311-313.
Non-Patent Reference 17: Wanunu, M.; Popovitz-Biro, R.; Cohen, H.; Vaskevich, A.; Rubinstein, I. J. Am. Chem. Soc., 2005, 127, 9207-9215.
Non-Patent Reference 18: Zamborini, F. P.; Hicks, J. F.; Murray, R. W. J. Am. Chem. Soc. 2000, 122, 4514-4515.
Non-Patent Reference 19: Hartling, T.; Alaverdyan, Y.; Hille, A; Wenzel, M. T.; Kall, L. M., Optics. Express, 2008, 16, 12362-12371.
Non-Patent Reference 20 Raffa, P.; Evangelisti, C.; Vitulli, G.; Salvadori, P. Tetrahedron Lett, 2008, 49, 3221-3224.

DISCLOSURE OF THE INVENTION

Problems that the Invention is to Solve

The present invention has been made for solving the problems with the conventional art as above, and an object of the invention is to provide a metal nanoparticle array structure, in which the size and the shape of the metal nanoparticles and also the distance between the metal nanoparticles are well uniformly controlled, the metal nanoparticle arrays are firmly immobilized on the substrate via chemical bonds or the like and the coverage with the metal nanoparticle arrays is high, and to provide a production apparatus and a production method for the metal nanoparticle array structure.

Means for Solving the Problems

For solving the above-mentioned problems, the invention provides a metal nanoparticle array structure mentioned below, and a production method and a production apparatus for the metal nanoparticle array structure.

The metal nanoparticle array structure of the invention comprises a substrate, a immobilizing layer formed on one surface of the substrate, and metal nanoparticle arrays formed on one surface of the immobilizing layer, wherein the metal nanoparticle arrays are so arrayed that multiple metal nanoparticles can be at regular intervals and the metal nanoparticles are bonded to each other via the modifying part arranged on a surface thereof while the metal nanoparticles are immobilized on one surface of the immobilizing layer via chemical bonds.

In the metal nanoparticle array structure of the invention, a distance between the metal nanoparticles is from 1 to 10 nm.

In the metal nanoparticle array structure of the invention, a particle size of the metal nanoparticles is from 1 to 100 nm.

In the metal nanoparticle array structure of the invention, the metal nanoparticles are formed of gold.

In the metal nanoparticle array structure of the invention, the modifying part is an organic molecule having a thiol group, and the thiol group is bonded to the metal nanoparticles.

In the metal nanoparticle array structure of the invention, the organic molecule of the modifying part has an alkyl chain with from 6 to 20 carbon atoms.

In the metal nanoparticle array structure of the invention, the immobilizing layer comprises an organic molecule having at least two thiol groups, at least one thiol group is arranged on both one surface and the other surface of the immobilizing layer, and the thiol group on the other surface is bonded to the substrate.

In the metal nanoparticle array structure of the invention, the organic molecule to constitute the immobilizing layer has an alkyl chain with from 6 to 20 carbon atoms.

In the metal nanoparticle array structure of the invention, the substrate is an electroconductive substrate.

In the metal nanoparticle array structure of the invention, the substrate comprises an insulating substrate having an electroconductive thin film formed on one surface thereof.

The production apparatus for the metal nanoparticle array structure of the invention comprises a liquid bath, a lid to cover an opening of the liquid bath, two electrodes capable of being placed opposite to each other inside the liquid bath, and a power source connected to the two electrodes by wiring, and is provided with a liquid level position moving unit capable of moving a position of a liquid level of a reaction liquid to be filled in the liquid bath, relative to the electrode.

In the production apparatus for the metal nanoparticle array structure of the invention, the liquid level position moving unit is a hole which is formed through the lid and of which the opening size is variable.

In the production apparatus for the metal nanoparticle array structure of the invention, the liquid level position moving unit is a pull-up part capable of pulling up one of the two electrodes in the direction toward the lid.

The production method for the metal nanoparticle array structure of the invention comprises a first step of dispersing metal nanoparticles in a solvent to prepare a reaction liquid, filling a liquid tank with the reaction liquid, and arranging two electrodes oppositely to each other as immersed in the reaction liquid, and a second step of applying a voltage to the two electrodes from a power source connected to the two electrodes by wiring, whilst moving a position of a liquid level of the reaction liquid relative to the electrode thereby forming metal nanoparticle arrays on one surface of one of the electrodes.

In the production method for the metal nanoparticle array structure of the invention, a moving speed of the liquid level of the reaction liquid is at most 0.02 mm/sec.

In the production method for the metal nanoparticle array structure of the invention, a volatile solvent is used as the solvent in the first step, and the volatile solvent is evaporated away through voltage application in the second step to thereby move the position of the liquid level of the reaction liquid relative to the electrode.

In the production method for the metal nanoparticle array structure of the invention, the volatile solvent is any of water, an alcohol, a ketone, an ester, a halogen-containing solvent, an aliphatic hydrocarbon or an aromatic hydrocarbon, or their mixture.

In the production method for the metal nanoparticle array structure of the invention, the volatile solvent contains an inorganic salt, an organic salt or both of the two.

In the production method for the metal nanoparticle array structure of the invention, one of the two electrodes is pulled up in the direction toward the lid during voltage application in the second step, thereby moving the position of the liquid level of the reaction liquid relative to the electrode.

In the production method for the metal nanoparticle array structure of the invention, metal nanoparticles having a particle size of from 1 to 100 nm are used.

In the production method for the metal nanoparticle array structure of the invention, metal nanoparticles modified with an organic molecule are used.

In the production method for the metal nanoparticle array structure of the invention, a substrate provided with a immobilizing layer is used as one of the two electrodes, and one surface side of the immobilizing layer is placed opposite to the other electrode.

In the production method for the metal nanoparticle array structure of the invention, the substrate is an electroconductive substrate.

In the production method for the metal nanoparticle array structure of the invention, the substrate comprises an insulating substrate having an electroconductive thin film formed on one surface thereof.

In the production method for the metal nanoparticle array structure of the invention, a carbon electrode is used as another electrode.

In the production method for the metal nanoparticle array structure of the invention, the metal nanoparticle arrays are annealed at a temperature falling within a range of from 30 to 80° C. after the second step.

Advantage of the Invention

The metal nanoparticle array structure of the invention comprises a substrate, a immobilizing layer formed on one surface of the substrate, and metal nanoparticle arrays formed on one surface of the immobilizing layer, wherein the metal nanoparticle arrays are so arrayed that multiple metal nanoparticles can be at regular intervals and the metal nanoparticles are bonded to each other via a modifying part arranged on a surface thereof while the metal nanoparticles are immobilized on one surface of the immobilizing layer via chemical bonds. In the structure, therefore, the distance between the metal nanoparticles can be controlled constantly on a nanoscale level and the chemical bonds to the substrate are easy to form. Consequently, the invention can provide the metal nanoparticle array structure which comprises metal nanoparticle arrays of multiple metal nanoparticles that are uniform in point of the size and the shape thereof and are uniform in point of the distance between them, and in which the metal nanoparticle arrays are firmly immobilized on the substrate via chemical bonds or the like and the coverage with the metal nanoparticle arrays is high.

The metal nanoparticle array structure of the invention is so constituted that the modifying part is a thiol group-having organic molecule and the thiol group is bonded to the metal nanoparticles. Consequently, the invention can provide the metal nanoparticle array structure in which multiple metal nanoparticles are bonded firmly to each other and the distance between the metal nanoparticles is controlled constantly on a nano-scale level of 1 to 10 nm thereby to provide metal nanoparticle arrays that are uniform in point of the size and the shape thereof and are uniform in point of the distance between them, and in which the coverage with the metal nanoparticle arrays is high.

The production apparatus for the metal nanoparticle array structure of the invention comprises a liquid bath, a lid to cover an opening of the liquid bath, two electrodes capable of being placed opposite to each other inside the liquid bath, and a power source connected to the two electrodes by wiring, and is provided with a liquid level position moving unit capable of moving a position of a liquid level of a reaction liquid to be filled in the liquid bath, relative to the electrode. In the apparatus, therefore, the liquid level can be moved to thereby form nucleation of two-dimensional arraying of metal nanoparticles in the air-liquid interface to be exposed out by the moving, and the apparatus can readily provide the metal nanoparticle array structure that has metal nanoparticle arrays firmly immobilized to the substrate via chemical bonds or the like and having a high coverage.

The production method for the metal nanoparticle array structure of the invention comprises a first step of dispersing metal nanoparticles in a solvent to prepare a reaction liquid, filling a liquid tank with the reaction liquid, and arranging two electrodes oppositely to each other as completely immersed in the reaction liquid, and a second step of applying a voltage to the two electrodes from a power source connected to the two electrodes by wiring, whilst moving a position of a liquid level of the reaction liquid relative to the electrode thereby forming metal nanoparticle arrays on one surface of one of the electrodes. According to the production method, therefore, the metal nanoparticles kept charged in the reaction liquid can be moved through field migration to one surface of the electrode and can promote chemical bond formation owing to the electric interaction whereby the metal nanoparticle arrays are firmly immobilized on the substrate, and the production method thus provides the metal nanoparticle array structure in which the coverage with the metal nanoparticle arrays is high.

In the production method far the metal nanoparticle array structure of the invention, a volatile solvent is used as the solvent in the first step and the volatile solvent is evaporated away through voltage application in the second step to thereby move the position of the liquid level of the reaction liquid relative to the electrode. Consequently, in the production method, the volatile solvent is evaporated away to form nuclei of two-dimensional arraying of metal nanoparticles around the air-liquid interface, and the method can therefore provide the metal nanoparticle array structure, in which the distance between the metal nanoparticles is nearly constant and the metal nanoparticle arrays are firmly immobilized to the substrate via chemical bonds or the like, and in which the coverage with the metal nanoparticle arrays is high.

In the production method for the metal nanoparticle array structure of the invention, one of the two electrodes is pulled up in the direction toward the lid during voltage application in the second step, thereby moving the position of the liquid level of the reaction liquid relative to the electrode. Consequently, in the method, nuclei of two-dimensional arraying of metal nanoparticles are formed around the air-liquid interface, and the method can therefore provide the metal nanoparticle array structure, in which the distance between the metal nanoparticles is nearly constant and the metal nanoparticle arrays are firmly immobilized to the substrate via chemical bonds or the like, and in which the coverage with the metal nanoparticle arrays is high.

BRIEF DESCRIPTION OF THE DRAWINGS

FIG. 1(a) is a plan view; FIG. 1(b) is a cross-sectional view through the A-A' line in FIG. 1(a); FIG. 1(c) is an enlarged view of the part B in FIG. 1(a); and FIG. 1(d) is an enlarged view of the part C in FIG. 1(b).

FIG. 2(a) is a conceptual view of the part C in FIG. 1(d); and FIG. 2(b) is a conceptual view of the part B in FIG. 1(a).

DESCRIPTION OF REFERENCE NUMERALS AND SIGNS

1 Substrate
1a One Surface
2 Immobilizing Layer
2a One Surface
2b Other Surface
3 Metal Nanoparticle Array
4 Metal Nanoparticle
5 Modifying Part
6 Electroconductive Thin Film
7 Insulating Substrate
7a One Surface
8 Domain
10, 11 Metal Nanoparticle Array Structure
21 Solvent
22 Reaction Liquid
22a Liquid Level
23 Liquid Tank
23c Opening
23d Inside
24 Lid
24c, 24d Hole
25, 26 Electrode
25a One Surface
27 Wiring
28 Power Source
29 Air-Liquid Interface
30, 31 Production Apparatus
35 Pull-Up Part
36 Support Wire
39 Liquid Level Position Moving Unit
Fm Particle Size
Gm Gap Distance (Distance)
Lm Particle-to-Particle Distance
O Center
Ls Particle-to-Substrate Distance
Gs Thickness of Immobilizing Layer

MODE FOR CARRYING OUT THE INVENTION

First Embodiment of the Invention

A metal nanoparticle array structure of the first embodiment of the invention is described with reference to the attached drawings.

Figure 1:
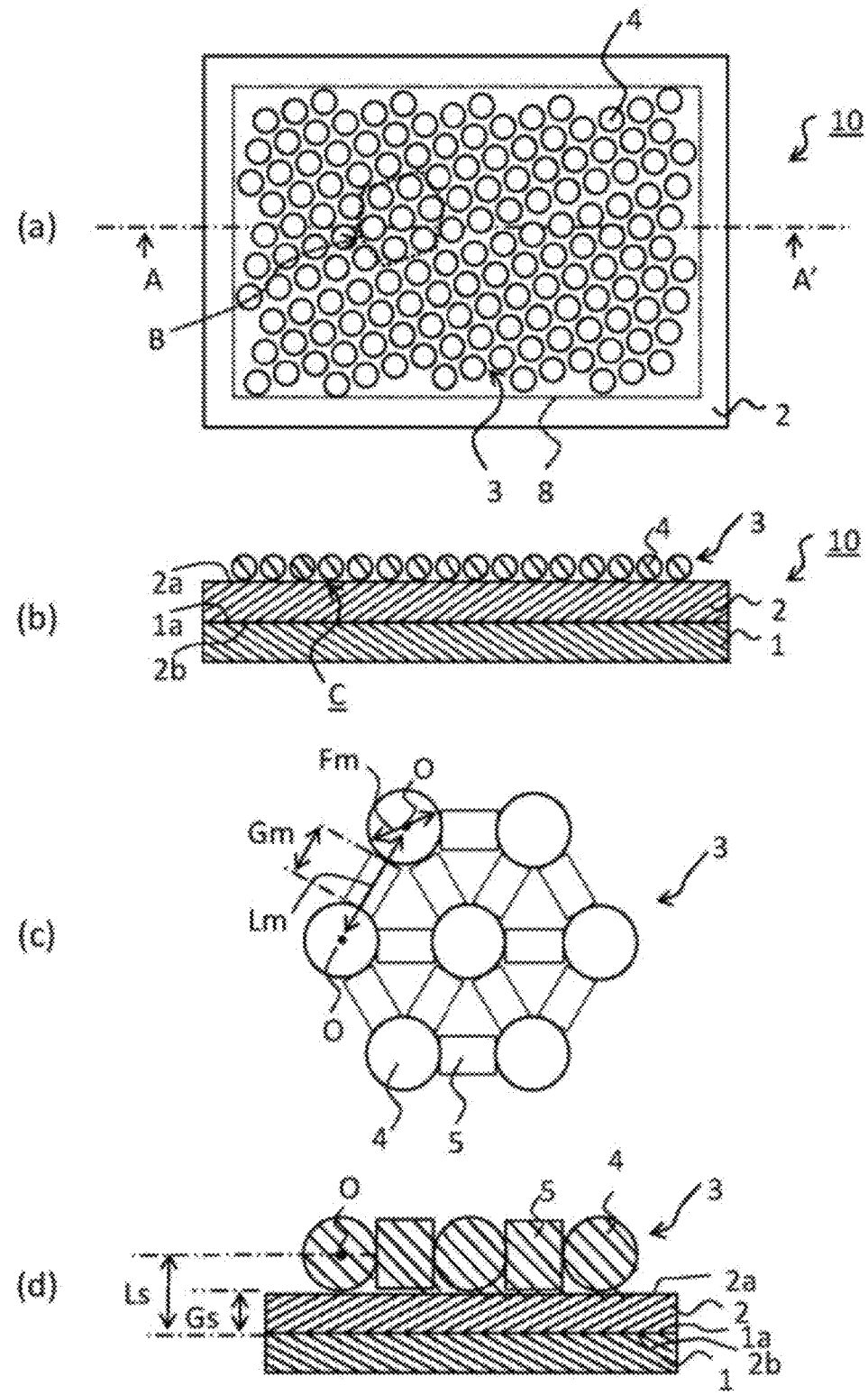
FIG. 1: This shows one example of the metal nanoparticle array structure of an embodiment of the invention.
Figure 2:
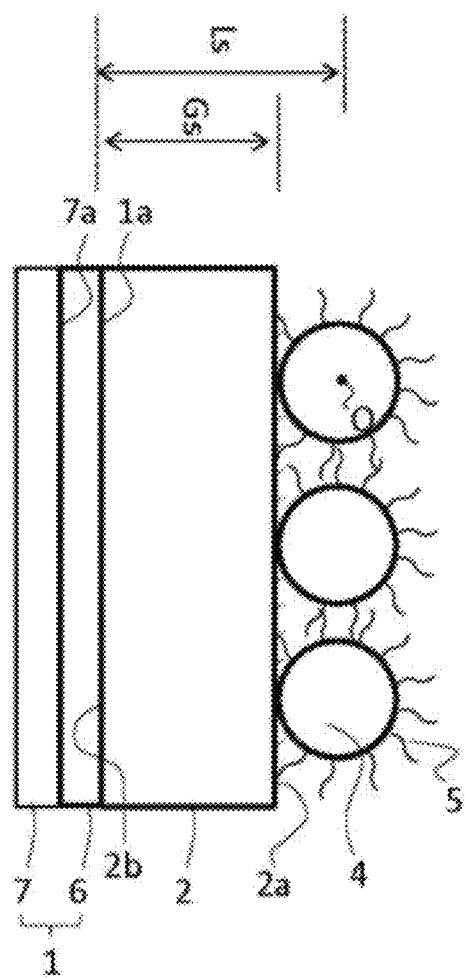
FIG. 2: This shows enlarged conceptual views of the metal nanoparticle array structure of an embodiment of the invention.
Figure 2:
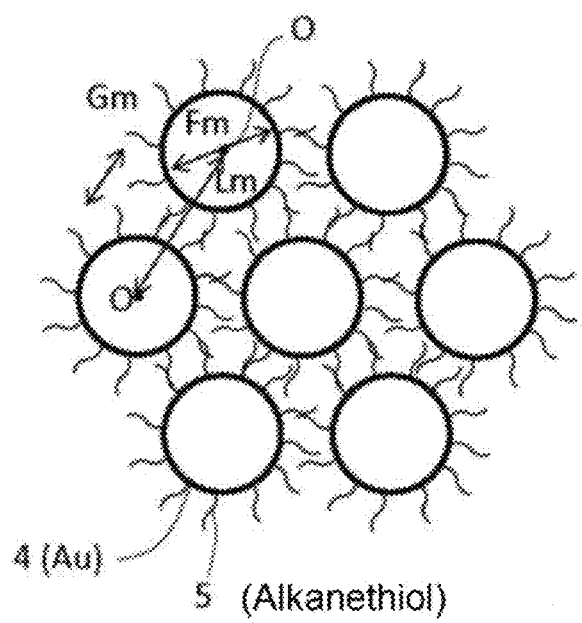

FIG. 1 and FIG. 2 are views showing one example of the metal nanoparticle array structure of the first embodiment of the invention. FIG. 1(a) is a plan view; FIG. 1(b) is a cross-sectional view through the A-A' line in FIG. 1(a); FIG. 1(c) is an enlarged view of the part B in FIG. 1(a); and FIG. 1(d) is an enlarged view of the part C in FIG. 1(b).

As shown in FIG. 1(a), the metal nanoparticle array structure 10 of the first embodiment of the invention comprises, as an outline, multiple metal nanoparticles 4 arrayed with regularity on the Immobilizing layer 2. The multiple metal nanoparticles 4 arrayed with regularity are referred to as metal nanoparticle arrays 3. The region where the metal nanoparticle arrays 3 are arrayed with the same regularity is referred to as a domain 8. In the domain 8 in FIG. 1(a), the metal nanoparticles 4 are arrayed at regular intervals.

As shown in FIG. 1(b), the metal nanoparticle array structure 10 comprises the substrate 1, the Immobilizing layer 2 formed on one surface 1a of the substrate 1, and the metal nanoparticle arrays 3 of multiple metal nanoparticles 4 arrayed with regularity on one surface 2a of the Immobilizing layer 2.

As the substrate 1, an electroconductive substrate is usable. Accordingly, the Immobilizing layer 2 can be bonded thereto firmly and easily. As the substrate 1, also usable is a substrate that comprises an electroconductive thin film and an insulating substrate. Firmly bonding the immobilizing layer 2 to the electroconductive thin film enables firm bonding between the substrate 1 and the immobilizing layer 2.

As shown in FIG. 1(c), the metal nanoparticles 4 having a modifying part 5 on a surface thereof and having a particle size of Fm are arrayed to constitute the metal nanoparticle array 3.

Via the modifying part 5, the metal nanoparticles 4 are firmly bonded to each other, and the gap distance Gm between the metal nanoparticles 4 and the particle-to-particle distance Lm between the centers O of the adjacent metal nanoparticles 4 are controlled to be nearly constant.

Preferably, the gap distance Gm between the metal nanoparticles 4 is from 1 to 10 nm, more preferably from 1 to 5 nm. Consequently, the metal nanoparticles 4 can be bonded firmly to each other.

Preferably, the particle size Fm of the metal nanoparticles 4 is from 1 to 100 nm, more preferably from 1 to 50 nm. Consequently, the regularity of the metal nanoparticle arrays can be increased and the area of the domain 8 can be broadened to thereby increase the coverage with the arrays.

As shown in FIG. 1(d), the immobilizing layer 2 having a thickness of Gs is formed on the substrate 1. Metal nanoparticles 4 are arranged on one surface 2a of the Immobilizing layer 2 with regularity, thereby constituting the metal nanoparticle arrays 3 thereon.

The distance from one surface 1a of the substrate 1 to the center O of the metal nanoparticle 4 (particle-to-substrate distance) Ls is kept nearly constant.

Preferably, gold is used as the material for the metal nanoparticles 4. This is because gold can readily form uniformly-shaped and uniformly-sized particles and because the modifying part 5 of an organic molecule having a thiol group or the like can be readily bonded to gold.

The modifying part 5 is preferably an organic molecule having a thiol group such as an alkanethiol or the like. This is because the thiol group can readily bond to the metal nanoparticle 4 and can firmly bond the metal nanoparticles 4 to each other. In particular, when gold nanoparticles are used as the metal nanoparticles, they can be bonded more firmly.

Using organic molecules provides intermolecular interaction between the organic molecules for bonding the metal nanoparticles 4 to each other, thereby keeping nearly constant the gap distance Gm between the metal nanoparticles 4 and the distance Lm between the centers O of the adjacent metal nanoparticles 4.

Selecting predetermined organic particles to be between the metal nanoparticles 4 makes it possible to control the gap distance Gm and the particle-to-particle distance Lm between the adjacent particles.

Preferably, the organic molecule of the modifying part 5 has an alkyl chain with from 6 to 20 carbon atoms. This is because the organic molecule of the type is easy to handle, and can readily form the desired metal nanoparticle array structure.

Preferably, the Immobilizing layer 2 comprises organic molecules having at least two thiol groups such as alkanedithiol, etc.

By arranging multiple organic molecules on one surface 1a of the substrate 1 nearly vertically thereto, the thickness Gs of the immobilizing layer 2 and the particle-to-substrate distance Ls from the center O of the metal nanoparticle 4 to one surface 1a of the substrate can be made constant.

In case where an electroconductive substrate is used as the substrate 1, at least one thiol group of each organic molecule on the other side 2b of the Immobilizing layer 2 can be firmly bonded to one surface 1a of the substrate 1. In case where an insulating substrate with an electroconductive thin film formed thereon is used as the substrate 1, the thiol group of the immobilizing layer 2 can be firmly bonded to the electroconductive thin film.

At least one thiol group of each organic molecule on one side 2a of the Immobilizing layer 2 can be firmly bonded to the metal nanoparticle 4 via a chemical bond therebetween, as substituted for the organic molecule of the modifying part 5 of the metal nanoparticle 4.

Preferably, the organic molecule of the Immobilizing layer has an alkyl chain with from 6 to 20 carbon atoms. This is because the organic molecule of the type is easy to handle, and can readily form the desired metal nanoparticle array structure.

FIG. 2 includes conceptual views more concretely showing the modifying part 5 and the Immobilizing layer 2 of FIG. 1(c) and FIG. 1(d).

In FIG. 2(b), plural modifying parts 5 each formed of a single-chain alkanethiol (organic molecule) are formed, as extending toward the outside from the surface of the metal nanoparticle 4 of gold. Though not shown in the drawing, the thiol group of each alkanethiol is bonded to the metal nanoparticle 4 of gold.

As shown in FIG. 2(a), an insulating substrate 7 with an electroconductive thin film 6 formed on one surface 7a thereof is used as the substrate 1. On one surface 1a of the substrate, or that is, on the surface of the electroconductive thin film 6, the Immobilizing layer 2 is formed.

The immobilizing layer 2 is formed of multiple alkanedithiol molecules arranged nearly vertically to one surface 1a of the substrate 1. Accordingly, the thickness Gs of the Immobilizing layer 2 is kept almost constant.

At least one thiol group of each organic molecule is arranged on the side of one surface 2a of the Immobilizing layer 2, and another thiol group of each organic molecule is arranged on the side of the other surface 2b of the Immobilizing layer 2. The thiol group on the side of the other surface 2b is bonded to one surface 1a of the substrate 1, or that is, to the electroconductive thin film. Accordingly, the immobilizing layer 2 is firmly bonded to the substrate 1.

At least one thiol group of each organic molecule arranged on the side of one surface 2a of the immobilizing layer 2 is bonded to the metal nanoparticle 4. Accordingly, the metal nanoparticles 4 are firmly bonded to the Immobilizing layer 2.

Figure 3:
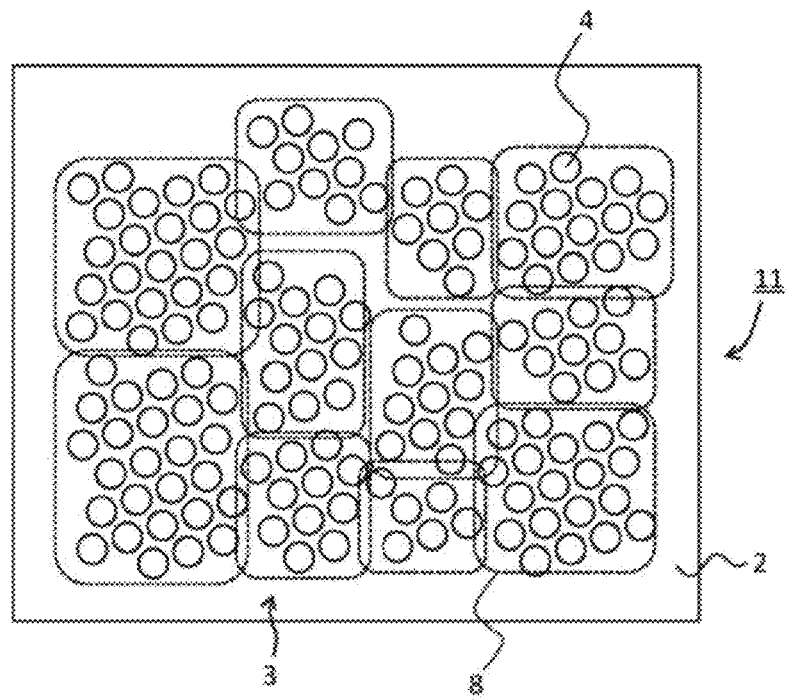
FIG. 3: This is a plan view showing another example of the metal nanoparticle array structure of an embodiment of the invention.

FIG. 3 is a plan view showing another example of the metal nanoparticle array structure of an embodiment of the invention. The metal nanoparticle array structure 11 is composed of 11 domains 8.

As described with reference to FIG. 1(c) and FIG. 1(d), the metal nanoparticle arrays 3 are controlled in point of the nearest neighbor structure thereof. Ideally, from the second near position to the third near position and to a further remoter position, the ordered state is kept. In this case, an ideal two-dimensional structure of metal nanoparticle arrays 3 of metal nanoparticles 4 is formed, as shown in FIG. 1.

However, when the production condition for the metal nanoparticle arrays is changed, the ordered state of the second near position, the third near position and further remoter positions could not be maintained as the case may be. In such a case, multiple domains 8 where the ordered state is kept may be formed, as shown in FIG. 3

The invention covers the metal nanoparticle array structure 11 having such multiple domains 8. Also in this case, the metal nanoparticle array structure secures a predetermined coverage or more.

Second Embodiment of the Invention

Next described is a production apparatus 30 for the metal nanoparticle array structure of the second embodiment of the invention.

Figure 4:
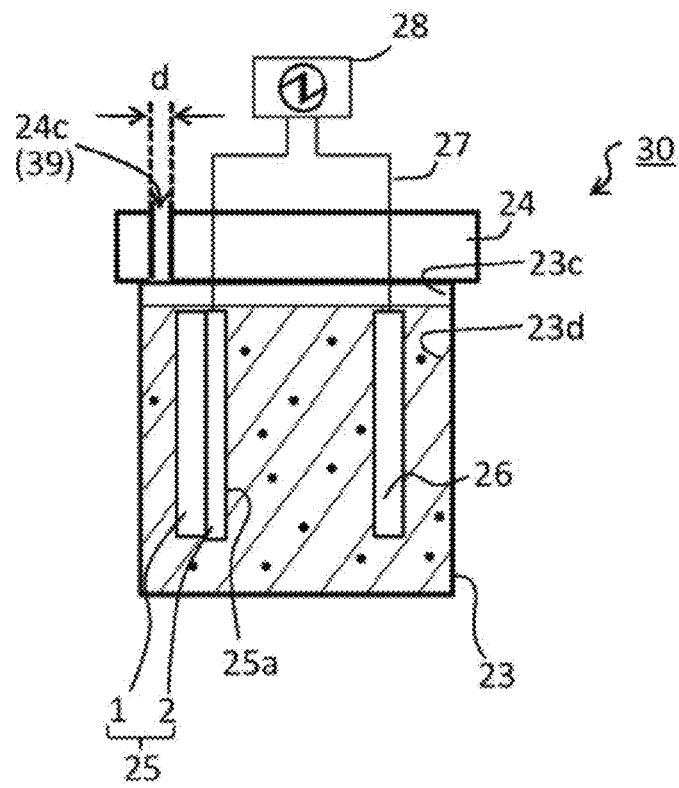
FIG. 4: This is a view showing one example of the production apparatus for the metal nanoparticle array structure of an embodiment of the invention.

FIG. 4 is a schematic cross-sectional view showing one example of a production apparatus 30 for the metal nanoparticle array structure of the second embodiment of the invention.

As shown in FIG. 4, the production apparatus 30 for the metal nanoparticle array structure comprises, as the skeleton framework thereof, a liquid tank 23, a lid 24 to cover the opening 23c of the liquid tank 23, two electrodes 25 and 26 arranged inside 23d of the liquid tank 23 to face each other therein, and a power source 28 bonded to the two electrodes 25 and 26 via a wiring 27 therebetween.

The lid 24 is provided with a hole 24c having a variable opening diameter d, which is to be the liquid level position moving unit 39 capable of moving the position of the liquid level 22a of the reaction liquid 22 to be filled in the liquid tank 23, relative to the electrode 25. One electrode 25 is so arranged that one surface 25a of the substrate 1 could face the other electrode 26. As one electrode 25, used is the substrate 1 with the immobilizing layer 2 laminated thereon.

Third Embodiment of the Invention

Next described is a production method for the metal nanoparticle array structure of the third embodiment of the invention.

A production method for the metal nanoparticle array structure of the third embodiment of the invention comprises a first step of dispersing metal nanoparticles 4 in a solvent to prepare a reaction liquid, filling a liquid tank with the reaction liquid, and arranging two electrodes inside the liquid tank to face each other therein, as completely immersed in the reaction liquid, and a second step of applying a voltage to the two electrodes from a power source connected to the two electrodes by wiring, thereby moving the metal nanoparticles in a mode of field migration and forming metal nanoparticle arrays on one surface of one of the electrodes.

Figure 5:
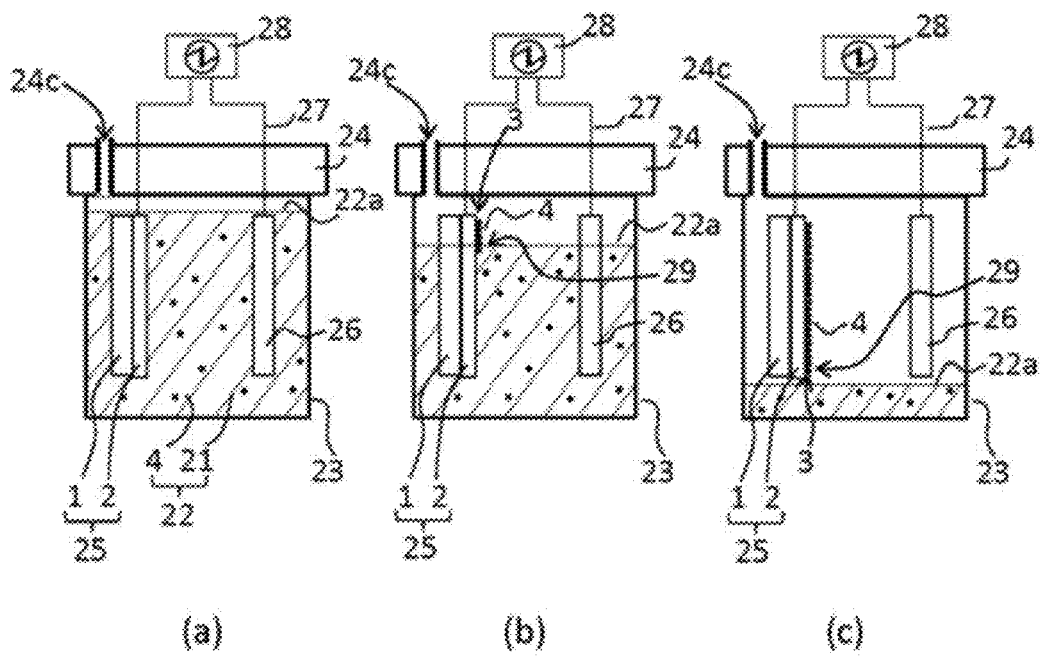
FIG. 5: This is a process chart showing one example of the production method for the metal nanoparticle array structure of an embodiment of the invention.

FIG. 5 is a process chart showing one example of the production method for the metal nanoparticle array structure of an embodiment of the invention.

FIG. 5(a) is a cross-sectional view of the production process at the end of the first step, in which the metal nanoparticles 4 are dispersed in the solvent 21 to prepare a reaction liquid 22, then the reaction liquid 22 is put into the liquid tank 23, and then two electrodes 25 and 26 are arranged inside 23d of the liquid tank 23 to face each other therein, as completely immersed in the reaction liquid 22.

As the solvent 21, used is a volatile solvent. The metal nanoparticle 4 is previously covered with the modifying part 5 of an organic molecule.

As one electrode 25, used is the substrate 1 with the immobilizing layer 2 formed thereon. As the substrate 1, used is an electroconductive substrate, and the substrate is so arranged that the therebetween layer 2 faces the other electrode 26.

The liquid level 22a of the reaction liquid 22 is set at such a position that the two electrodes 25 and 26 could be completely immersed in the reaction liquid 22.

Preferably, the volatile solvent 21 is any of water, alcohols, ketones, esters, halogen solvents, aliphatic hydrocarbons, or aromatic hydrocarbons, or their mixtures. Accordingly, the kinetic and thermodynamic parameters in forming the structure of the metal nanoparticles can be controlled.

Preferably, the volatile solvent 21 contains an inorganic salt or an organic salt, or both of the two. Accordingly, the force in electrophoresis of the metal nanoparticles given by the electric field can be controlled.

The second step is a step of evaporating the solvent 21 from the reaction liquid 22 with applying a voltage to the two electrodes 25 and 26 from the power source 28 to thereby make the direct current run through the reaction liquid 22.

When the direct current is made to run through the reaction liquid 22, the charged metal nanoparticles 4 in the reaction liquid 22 begin to move through field migration, and begin to get together around any one of the electrodes.

For example, in case where minus-charged metal nanoparticles 4 are used, they get together around the anode electrode having a plus potential opposite thereto. Accordingly, when one electrode 25 is used as the anode electrode, then metal nanoparticles 4 get together on the one electrode 25.

As in the above, the matter as to whether the substrate (electroconductive substrate) 1 on which metal nanoparticles arrays are formed is an anode electrode or a cathode electrode is determined depending on the charge potential of the metal nanoparticles 4.

The metal nanoparticles 4 have an ionic energy of electric field×moving distance×charge valence. Accordingly, owing to the ionic energy, the metal nanoparticles 4 are chemically adsorbed by the substrate (electroconductive substrate) 1 having broken through the energy barrier. In the absence of the ionic energy, the substrate could not chemically adsorb the metal nanoparticles having broken through the energy barrier, but could adsorb them merely physically.

FIG. 5(b) is a cross-sectional view of the production process at the intermediate point of the second step.

During voltage application, the space above the liquid level 22a on the side of the lid 24 is kept communicating with the outside via the hole 24c of the lid 24, and therefore the volatile solvent evaporates away through the hole 24c.

Accordingly, the liquid level 22a of the reaction liquid 22 somewhat descends, whereby a part of the substrate (electroconductive substrate) 1 by the side of the lid 24 is exposed out of the liquid level 22a.

With the descending of the liquid level 22a, the position of the part on one surface of the immobilizing layer 2 and near the liquid level 22a but exposed out of the liquid level 22a (air-liquid interface 29) also descends.

In the air-liquid interface 29, the concentration of the metal nanoparticles 4 is saturated, thereby resulting in nucleation for the two-dimensional arrays of the supersaturated metal nanoparticles 4. In case where the nucleation speed for the two-dimensional arrays of the metal nanoparticles 4 is higher than the evaporation rate of the volatile solvent 21 in the reaction liquid 22, the coverage with the metal nanoparticle arrays 3 could be nearly 100%. Accordingly, the metal nanoparticle arrays 3 can be formed at such a high coverage on the immobilizing layer 2 on the exposed substrate (electroconductive substrate) 1.

The volatilization rate of the volatile solvent 21 can be controlled by controlling the fluid-dynamic resistance to be determined by the opening diameter d and the length of the hole 24c and by the viscosity of the vapor of the volatile solvent (viscosity×length/opening diameter). Accordingly, the descending speed of the liquid level 22a can be thereby controlled.

Chemical adsorption of the metal nanoparticles 4 by the immobilizing layer 2 occurs simultaneously with the nucleation for the two-dimensional arrays of the metal nanoparticles 4.

When the ionic energy is not too large, a sufficient period of time could be provided for securing the energetically-stable physical position necessary for nucleation prior to chemical adsorption, thereby satisfying both chemical adsorption and two-dimensional arraying.

FIG. 5(c) is a cross-sectional view of the production process at the end of the second step. The substrate (electroconductive substrate) 1 is completely above the liquid level 22a, and metal nanoparticle arrays 3 are formed on the immobilizing layer 2 on the substrate (electroconductive substrate) 1.

Thus, a metal nanoparticle array structure with the metal nanoparticles 4 firmly banded to the immobilizing layer 2 at a high coverage is formed.

Further, after the second step, the nanoparticle arrays 3 on the immobilizing layer 2 on the substrate (electroconductive substrate) 1 may be annealed, for example, at 55° C. or so. Accordingly, the chemical bond between the metal nanoparticles 4 and the immobilizing layer 2 can be thereby strengthened more. The suitable range of the annealing temperature varies depending on the type of the metal nanoparticles 4 to be used and the type of the immobilizing layer 2. In a case of gold nanoparticles and alkanedithiol molecules, the suitable annealing temperature falls within a range of from 40 to 70° C. By varying the metal nanoparticles and the immobilizing layer, the suitable annealing temperature may be controlled to fall within a range of from 30 to 80° C.

Subsequently, the surface of the substrate (electroconductive substrate) 1 is washed with running water or ultrasonically washed in a suitable solvent to thereby remove the metal nanoparticles 4 not chemically bonding to the substrate (electroconductive substrate) 1.

Fourth Embodiment of the Invention

Next, a production apparatus 31 for the metal nanoparticle array structure of the fourth embodiment of the invention is described.

Figure 6:
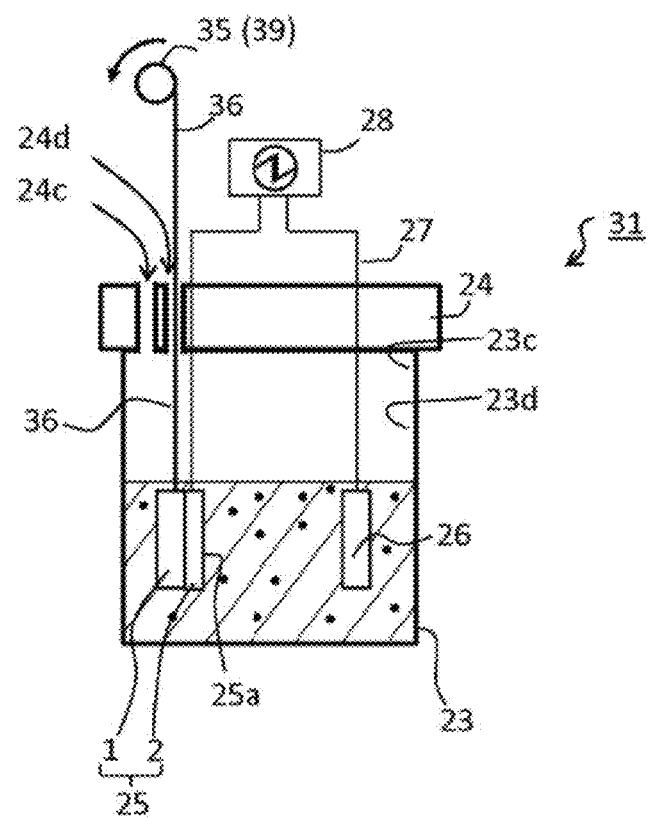
FIG. 6: This is a view showing another example of the production apparatus for the metal nanoparticle array structure of an embodiment of the invention.

FIG. 6 is a schematic cross-sectional view showing one example of a production apparatus 31 for the metal nanoparticle array structure of the fourth embodiment of the invention.

As shown in FIG. 6, the production apparatus 31 for the metal nanoparticle array structure of the fourth embodiment of the invention has the same configuration as that of the production apparatus 30 except that another hole 24d is formed in the lid 24, that a pull-up part 35 is arranged above the other hole 24d, and that a support wire 36 to connect the pull-up part 35 and one electrode 25 is arranged.

The support wire 36 is connected to the pull-up part 35 running through the hole 24d, and is so configured that, by winging up the support wire 36 by the pull-up part 35, one electrode 25 could be pulled up toward the direction of the lid 24. The pull-up part 35 functions as the liquid level position moving unit 39 capable of moving the position of the liquid level 22a of the reaction liquid 22 to be filled in the liquid tank 23, relative to the electrode 25.

Fifth Embodiment of the Invention

Next described is a production method for the metal nanoparticle array structure of the fifth embodiment of the invention.

Figure 7:
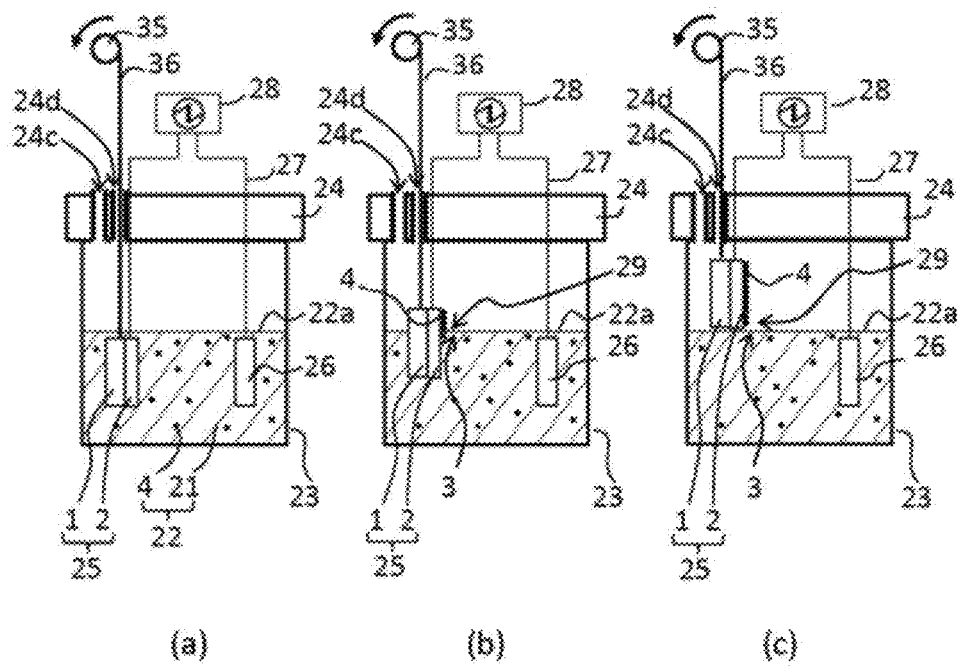
FIG. 7: This is a process chart showing another example of the production apparatus for the metal nanoparticle array structure of an embodiment of the invention.

FIG. 7 is a process chart showing one example of the production method for the metal nanoparticle array structure of the fifth embodiment of the invention.

FIG. 7(a) is a cross-sectional view of the production process at the end of the first step, in which the metal nanoparticles 4 are dispersed in the solvent 21 to prepare a reaction liquid 22, then the reaction liquid 22 is put into the liquid tank 23, and then two electrodes 25 and 26 are arranged inside 23d of the liquid tank 23 to face each other therein, as completely immersed in the reaction liquid 22.

As the solvent 21, used is a volatile solvent. The metal nanoparticle 4 is previously covered with the modifying part 5 of an organic molecule.

As one electrode 25, used is the substrate 1 with the immobilizing layer 2 formed thereon. As the substrate 1, used is an electroconductive substrate, and the substrate is so arranged that the immobilizing layer 2 faces the other electrode 26.

The liquid level 22a of the reaction liquid 22 is set at such a position that the two electrodes 25 and 26 could be completely immersed in the reaction liquid 22.

The second step is a step of pulling up one electrode 25 toward the direction of the lid 24 by winding up the support wire 36 by the pull-up part 35 while a voltage is applied to the two electrode 25 and 26 from the power source 28 to thereby make a direct current run through the reaction liquid 22.

When the direct current is made to run through the reaction liquid 22, the charged metal nanoparticles 4 in the reaction liquid 22 begin to move through field migration, and begin to get together around any one of the electrodes.

For example, in case where minus-charged metal nanoparticles 4 are used, they get together around the anode electrode having a plus potential opposite thereto. Accordingly, when one electrode 25 is used as the anode electrode, then metal nanoparticles 4 get together on the one electrode 25.

As in the above, the matter as to whether the substrate (electroconductive substrate) 1 on which metal nanoparticles arrays are formed is an anode electrode or a cathode electrode is determined depending on the charge potential of the metal nanoparticles 4.

The metal nanoparticles 4 have an ionic energy of electric field×moving distance×charge valence. Accordingly, owing to the ionic energy, the metal nanoparticles 4 are chemically adsorbed by the substrate (electroconductive substrate) 1 having broken through the energy barrier. In the absence of the ionic energy, the substrate could not chemically adsorb the metal nanoparticles having broken through the energy barrier, but could adsorb them merely physically.

FIG. 7(b) is a cross-sectional view of the production process at the intermediate point of the second step.

During voltage application, one electrode 25 is pulled up toward the direction of the lid 24 by the pull-up part 35 and a part of the substrate (electroconductive substrate) 1 by the side of the lid 24 is thereby exposed out of the liquid level 22a.

With the pulling up of the substrate (electroconductive substrate) 1, the position of the surface part of the immobilizing layer 2 on the substrate (electroconductive substrate) 1 with which the liquid level 22a of the reaction liquid 22 is kept in contact (air-liquid interface 29) also descends.

In the air-liquid interface 29, the concentration of the metal nanoparticles 4 is saturated owing to the evaporation of the solvent occurring near the air-liquid interface 29, thereby resulting in nucleation for the two-dimensional arrays of the supersaturated metal nanoparticles 4. In case where the nucleation speed for the two-dimensional arrays of the metal nanoparticles 4 is higher than the substrate pulling-up rate, the coverage with the metal nanoparticle arrays 3 could be nearly 100%. Accordingly, the metal nanoparticle arrays 3 can be formed at such a high coverage on the immobilizing layer 2 on the exposed substrate (electroconductive substrate) 1.

The pulling-up rate can be controlled by controlling the pull-up part 35.

Chemical adsorption of the metal nanoparticles 4 by the immobilizing layer 2 occurs simultaneously with the nucleation for the two-dimensional arrays of the metal nanoparticles 4.

When the ionic energy is not too large, a sufficient period of time could be provided for securing the energetically-stable physical position necessary for nucleation prior to chemical adsorption, thereby satisfying both chemical adsorption and two-dimensional arraying.

FIG. 7(c) is a cross-sectional view of the production process at the end of the second step. The substrate (electroconductive substrate) 1 is completely above the liquid level 22a, and metal nanoparticle arrays 3 are formed on the immobilizing layer 2 on the substrate (electroconductive substrate) 1.

Thus, a metal nanoparticle array structure with the metal nanoparticles 4 firmly bonded to the immobilizing layer 2 at a high coverage is formed.

After this, the structure is preferably annealed at a temperature falling within a range of from 30 to 80° C. Accordingly, the metal nanoparticles 4 can be more firmly bonded to the immobilizing layer 2.

A step of pulling up the substrate with evaporating the volatile solvent may also be employed here. Accordingly, the speed for exposing out one surface of the substrate 1 can be more surely and more accurately controlled.

The metal nanoparticle array structure 10, 11 of the embodiment of the invention comprises the substrate 1, the immobilizing layer 2 formed on one surface 1a of the substrate 1, and the metal nanoparticle arrays 3 formed on one surface 2a of the immobilizing layer 2, wherein the metal nanoparticle arrays 3 are so arrayed that the multiple metal nanoparticles 4 can be at regular intervals and the metal nanoparticles 4 are bonded to each other via the modifying part 5 arranged on the surface thereof while the metal nanoparticles 4 are immobilized on one surface 2a of the immobilizing layer 2 via chemical bonds. In the metal nanoparticle array structure having the configuration as above, therefore, the distance between the metal nanoparticles 4 can be controlled constantly on a nanoscale level and the chemical bonds to the substrate 1 are easy to form. Consequently, there is provided here the metal nanoparticle array structure which comprises the metal nanoparticle arrays 3 of multiple metal nanoparticles 4 that are uniform in point of the size and the shape thereof and are uniform in point of the distance between them, and in which the metal nanoparticle arrays 3 are firmly immobilized on the substrate 1 via chemical bonds or the like and the coverage with the metal nanoparticle arrays 3 is high.

In the metal nanoparticle array structure 10, 11 of the embodiment of the invention, the distance between the metal nanoparticles 4 is from 1 to 10 nm. In the structure, therefore, the metal nanoparticles 4 can be bonded firmly to each other.

In the metal nanoparticle array structure 10, 11 of the embodiment of the invention, the particle size of the metal nanoparticles 4 is from 1 to 100 nm. In the structure, therefore, a high regularity of the metal nanoparticle arrays can be secured and a high coverage can be thereby attained even though the area of the domain 8 is broad.

In the metal nanoparticle array structure 10, 11 of the embodiment of the invention, the metal nanoparticles 4 are formed of gold. Accordingly, not only the metal nanoparticles 4 having a uniform shape and a uniform particle size are easy to obtain but also the modifying part 5 of an organic molecule or the like having a thiol group or the like can be readily bonded to the metal nanoparticle 4.

In the metal nanoparticle array structure 10, 11 of the embodiment of the invention, the modifying part 5 is an organic molecule having a thiol group, and the thiol group is bonded to the metal nanoparticles 4. Accordingly, the metal nanoparticles can be bonded firmly to each other and can also be bonded firmly to the immobilizing layer 2.

In the metal nanoparticle array structure 10, 11 of the embodiment of the invention, the organic molecule of the modifying part 5 has an alkyl chain with from 6 to 20 carbon atoms and is therefore easy to handle. Accordingly, the intended metal nanoparticle array structure is easy to form.

In the metal nanoparticle array structure 10, 11 of the embodiment of the invention, the immobilizing layer 2 comprises an organic molecule having at least two thiol groups, at least one thiol group is arranged on both one surface and the other surface of the immobilizing layer, and the thiol group on the other surface is bonded to the substrate 1. Accordingly, the metal nanoparticle array structure 10 is firmly immobilized to the substrate 1 via covalent bonding therebetween.

In the metal nanoparticle array structure 10, 11 of the embodiment of the invention, the organic molecule to constitute the immobilizing layer 2 has an alkyl chain with from 6 to 20 carbon atoms. Therefore, free from dynamic behavior like that of liquid crystals, the nanoparticles are stably immobilized on the immobilizing layer like on the surface of a solid.

In the metal nanoparticle array structure 10, 11 of the embodiment of the invention, the substrate 1 is an electroconductive substrate. In the structure, therefore, at least one thiol group of the organic molecule of the immobilizing layer 2 can be firmly bonded to one surface 1*a* of the substrate 1.

In the metal nanoparticle array structure 10, 11 of the embodiment of the invention, the substrate 1 comprises an insulating substrate 7 having an electroconductive thin film 6 formed on one surface thereof. In the structure, therefore, the thiol group of the immobilizing layer 2 can be firmly bonded to the electroconductive thin film 6.

The production apparatus 30 for the metal nanoparticle array structure of the embodiment of the invention comprises a liquid bath 23, a lid 24 to cover the opening 23*c* of the liquid bath 23, two electrodes 25 and 26 capable of being placed opposite to each other inside 23*d* the liquid bath 23, and a power source 28 connected to the two electrodes 25 and 28 by wiring 27, and is provided with a liquid level position moving unit 39 capable of moving the position of the liquid level 22*a* of the reaction liquid 22 to be filled in the liquid bath 23, relative to the electrode 25. In the apparatus, therefore, the position of the liquid level 22*a* of the reaction liquid 22 relative to the electrode 25 can be moved at a given speed to thereby gradually expose outside a part of one surface of the immobilizing layer 2, or that is, a part near the liquid level 22*a* and exposed out of the liquid level 22*a* (air-liquid interface 29) to form the metal nanoparticle arrays 3 around the air-liquid interface 29 at a high coverage.

In the production apparatus 30 for the metal nanoparticle array structure of the embodiment of the invention, the liquid level position moving unit 39 is a hole 24*c* which is formed through the lid 24 and of which the opening size is variable. In the apparatus, therefore, the volatile solvent can be evaporated away at a given volatilization rate to thereby control the moving speed of the position of the liquid level 22*a* of the reaction liquid 22 relative to the electrode 25, and by gradually exposing outside the air-liquid interface 29, the metal nanoparticle arrays 3 can be formed at a high coverage near the air-liquid-interface 29.

The production method for the metal nanoparticle array structure of the embodiment of the invention comprises a first step of dispersing metal nanoparticles 4 in a solvent 21 to prepare a reaction liquid 22, filling a liquid tank 23 with the reaction liquid 22, and arranging two electrodes 25 and 26 oppositely to each other as immersed in the reaction liquid 22, and a second step of applying a voltage to the two electrodes 25 and 26 from a power source 28 connected to the two electrodes 25 and 26 by wiring 27, whilst moving the position of the liquid level 22*a* of the reaction liquid 22 relative to the electrode 25 thereby forming metal nanoparticle arrays on one surface of one electrode 25. In the method, therefore, the air-liquid interface 29 can be gradually exposed outside to collect metal nanoparticles 4 on one electrode 25 thereby forming metal nanoparticle arrays.

The production method for the metal nanoparticle array structure of the embodiment of the invention comprises a first step of dispersing metal nanoparticles 4 in a solvent 21 to prepare a reaction liquid 22, filling a liquid tank 23 with the reaction liquid 22, and arranging two electrodes 25 and 26 oppositely to each other as immersed in the reaction liquid 22, and a second step of applying a voltage to the two electrodes 25 and 26 from a power source 28 connected to the two electrodes 25 and 26 by wiring 27, whilst moving the position of the liquid level 22*a* of the reaction liquid 22 relative to the electrode 25 thereby forming organic nanoparticle arrays on one surface of one electrode 25. In the method, therefore, the air-liquid interface 29 can be gradually exposed outside to collect metal nanoparticles 4 on one electrode 25 thereby forming organic nanoparticle arrays.

In the production method for the metal nanoparticle array structure of the embodiment of the invention, the moving speed of the position of the liquid level 22*a* of the reaction liquid 22 is at most 0.02 mm/sec. In the method, therefore, the air-liquid interface 29 can be gradually exposed outside to thereby increase the coverage with the metal nanoparticle arrays 3.

In the production method for the metal nanoparticle array structure of the embodiment of the invention, a volatile solvent is used as the solvent 21 in the first step, and the volatile solvent is evaporated away through voltage application in the second step. In the method, therefore, the position of the liquid level 22*a* of the reaction liquid 22 relative to the electrode 35 can be moved to gradually expose outside the air-liquid interface 29, thereby forming the metal nanoparticle arrays 3 at a high coverage near the air-liquid interface 29.

In the production method for the metal nanoparticle array structure of the embodiment of the invention, the volatile solvent is any of water, an alcohol, a ketone, an ester, a halogen-containing solvent, an aliphatic hydrocarbon or an aromatic hydrocarbon, or their mixture. In the method, therefore, by changing the type of the solvent to be used, the kinetic and thermodynamic parameters in forming the structure of the metal nanoparticles 4 can be controlled.

In the production method for the metal nanoparticle array structure of the embodiment of the invention, the volatile solvent contains an inorganic salt, an organic salt or both of the two. In the method, therefore, the force in electrophoresis of the metal nanoparticles 4 given by the electric field can be controlled.

In the production method for the metal nanoparticle array structure of the embodiment of the invention, one electrode 25 of the two electrodes 25 and 26 is pulled up in the direction toward the lid 24 during voltage application in the second step. In the method, therefore, the position of the liquid level 22a of the reaction liquid 22 relative to the electrode 25 can be moved for nucleation in two-dimensional arraying of metal nanoparticles in the air-liquid interface 29, thereby forming the metal nanoparticle arrays 3 at a high coverage.

In the production method for the metal nanoparticle array structure of the embodiment of the invention, metal nanoparticles having a particle size of from 1 to 100 nm are used. In the method, therefore, a high regularity of the metal nanoparticle arrays can be secured and a high coverage can be thereby attained even though the area of the domain 8 is broad.

In the production method for the metal nanoparticle array structure of the embodiment of the invention, metal nanoparticles 4 modified with an organic molecule are used. In the method, therefore, the gap distance Gm between the metal nanoparticles 4 can be made constant.

In the production method for the metal nanoparticle array structure of the embodiment of invention, a substrate provided with the immobilizing layer 2 is used as one electrode 25 of the two electrodes 25 and 26, and one surface side of the immobilizing layer 2 is placed opposite to the other electrode 26. In the method, therefore, an electric field can be applied uniformly to one surface 2a of the immobilizing layer 2 to efficiently produce the metal nanoparticle array structure.

In the production method for the metal nanoparticle array structure of the embodiment of the invention, the substrate 1 is an electroconductive substrate. In the method, therefore, the immobilizing layer 2 can be bonded firmly to efficiently produce the metal nanoparticle array structure.

In the production method for the metal nanoparticle array structure of the embodiment of the invention, the substrate 1 comprises an insulating substrate 7 having an electroconductive thin film 6 formed on one surface 7a thereof. In the method, therefore, the immobilizing layer 2 can be bonded firmly to efficiently produce the metal nanoparticle array structure.

In the production method for the metal nanoparticle array structure of the embodiment of the invention, a carbon electrode is used as the other electrode 26. In the method, therefore, an electric field can be applied efficiently to the two electrodes 25 and 26 to efficiently produce the metal nanoparticle array structure.

In the production method for the metal nanoparticle array structure of the embodiment of the invention, the metal nanoparticle arrays formed on one electrode 25 are annealed at a temperature falling within a range of from 30 to 80° C. after the second step. In the method, therefore, the bonding strength between the substrate 1 and the immobilizing layer 2 and between the immobilizing layer 2 and the metal nanoparticles 4 can be enhanced more.

The metal nanoparticle array structure and its production apparatus and production method of the invention are not limited to the above-mentioned embodiments. Within the range of the technical scope of the invention, the embodiments thereof can be variously changed and modified. Specific examples of the embodiments are shown in the following Examples. However, the invention should not be limited to these Examples.

EXAMPLES

Example 1

Production Process for Metal Nanoparticle Array Structure

First prepared were gold nanoparticles having a particle size Fm of from 9 to 10 nm.

Next, the surfaces of the gold nanoparticles were modified with hexanethiol molecules (HEX).

Next, the hexanethiol molecule-modified gold nanoparticles were dispersed in a volatile solvent of n-hexane at a concentration of $5.7 \times 10^{13}$/ml to prepare a reaction liquid.

Next, an electroconductive thin film of gold (hereinafter referred to as gold thin film) was formed on a glass substrate (size of substrate, 15 mm×15 mm).

Next, the surface of the gold thin film was modified with 1,6-hexanedithiol to form a immobilizing layer.

Next, a liquid tank was filled with the reaction liquid.

Next, a glass substrate with the immobilizing layer and the gold thin film formed thereon as one electrode was arranged, and a carbon electrode was as the other electrode. These were completely immersed in the reaction liquid. The immobilizing layer was arranged to face the carbon electrode, and the distance between the two electrodes was 1.2 mm.

Next, a lid was fitted to cover the opening of the liquid tank, and the diameter of the hole formed in the lid was adjusted.

Next, a voltage of 1.0 V was applied between the gold thin film serving as a cathode and the carbon electrode serving as an anode, and the system was left at room temperature and under normal pressure (1 atmospheric pressure, 25° C.) for 2 hours.

After thus left, the volatile solvent evaporated away, and a metal nanoparticle array structure was produced of metal nanoparticle arrays formed on one surface of the immobilizing layer.

Example 2

A metal nanoparticle array structure was produced in the same manner as in Example 1 except that dodecanethiol (DOD) was used in place of the hexanethiol molecules.

Example 3

A metal nanoparticle array structure was produced in the same manner as in Example 1 except that hexadecanethiol (HEXD) was used in place of the hexanethiol molecules.

Comparative Example 1

An electroconductive thin film of gold (hereinafter referred to as gold thin film) was formed on a glass substrate (size of substrate, 15 mm×15 mm), and then the surface of the gold thin film was modified with 1,6-hexanedithiol to form a immobilizing layer.

Next, using HEX-modified gold nanoparticles, a metal nanoparticle array structure was formed on the immobilizing layer of the glass substrate with the immobilizing layer and the gold thin film formed thereon according to a known Langmuir method.

Example 4

A metal nanoparticle array structure was produced in the same manner as in Example 2 except that gold nanoparticles having a particle size Fm of from 29 to 30 nm were used.

Example 5

A metal nanoparticle array structure was produced in the same manner as in Example 1 except that an ITO substrate of a transparent electroconductive metal oxide (InTiO) was used in place of arranging the electroconductive thin film of gold (hereinafter referred to as gold thin film) on the substrate (size of substrate, 15 mm×15 mm). The ITO substrate used here is of a EL specification (GEOMATEC Co. Ltd.) and has an electroconductivity 10Ω/square.

Like in Example 1, a lid was fitted to cover the opening of the liquid tank, and the diameter of the hole formed in the lid was adjusted. The adjusted hole was smaller than in Example 1 for reducing the solvent evaporation rate herein.

Example 6

A metal nanoparticle array structure was produced in the same manner as in Example 5 except that dodecanethiol (DOD) was used in place of hexanethiol molecules.

Example 7

A metal nanoparticle array structure was produced in the same manner as in Example 5 except that hexadecanethiol (HEXD) was used in place of hexanethiol molecules.

Comparative Example 2

The surface of an ITO substrate (InTiO) of a transparent electroconductive metal oxide was modified with 1,6-hexanedithiol to form a immobilizing layer thereon.

Next, using HEX-modified gold nanoparticles, a metal nanoparticle array structure was formed on the immobilizing layer of the ITO substrate with the immobilizing layer formed thereon according to a known Langmuir method.

Example 8

A metal nanoparticle array structure was produced in the same manner as in Example 6 except that metal nanoparticles having a particle size Fm of from 29 to 30 nm were used.

Example 9

A metal nanoparticle array structure was produced in the same manner as in Example 6 except that metal nanoparticles having a particle size Fm of from 49 to 50 nm were used.
<Evaluation of Metal Nanoparticle Array Structure>

Figure 8:
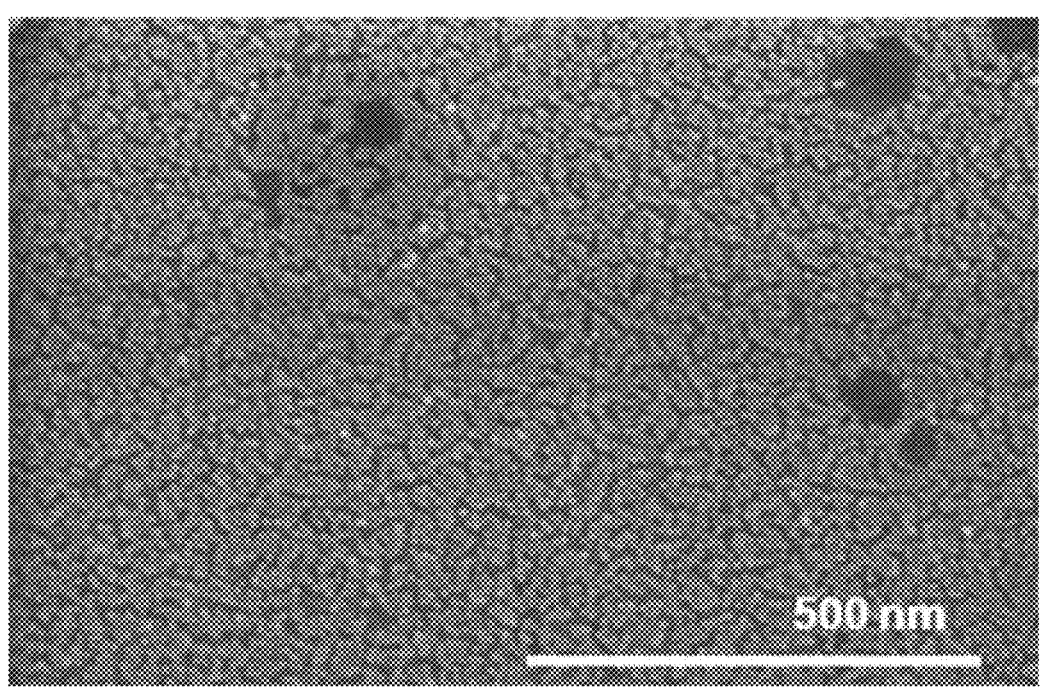
FIG. 8: This is a SEM image of the metal nanoparticle array structure of Example 1.
Figure 9:
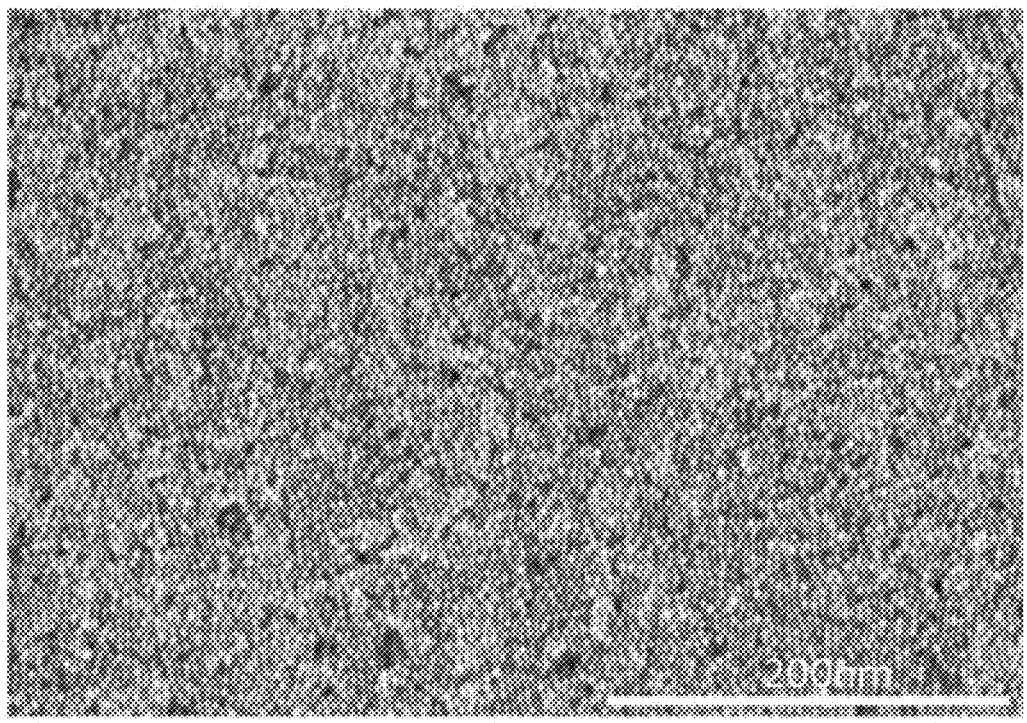
FIG. 9: This is a SEM image of the metal nanoparticle array structure of Example 2.
Figure 10:
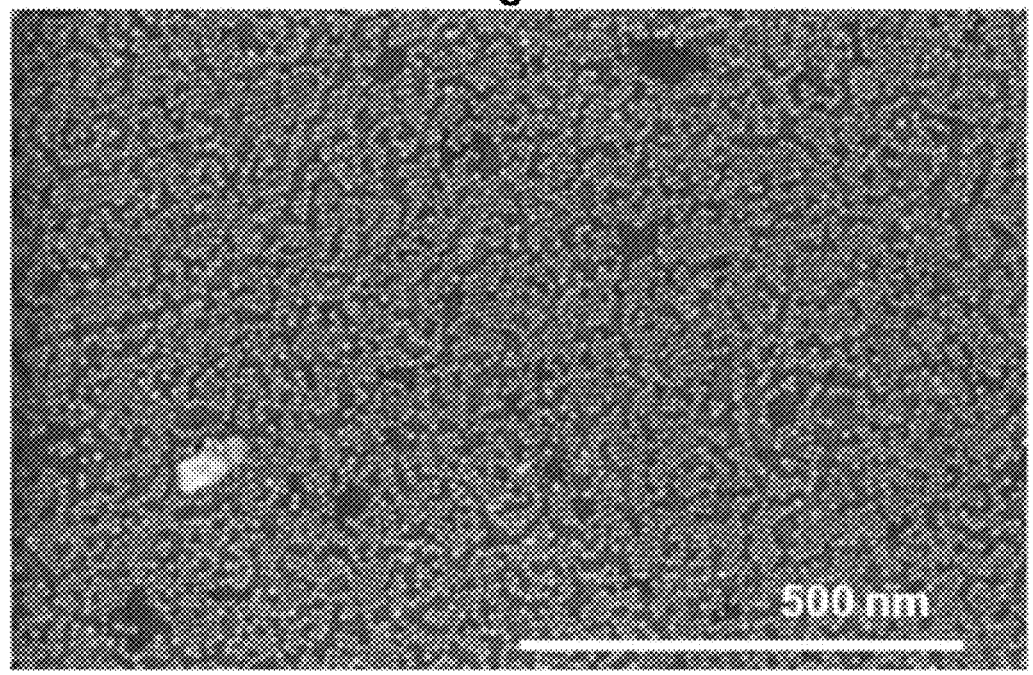
FIG. 10: This is a SEM image of the metal nanoparticle array structure of Example 3.
Figure 14:
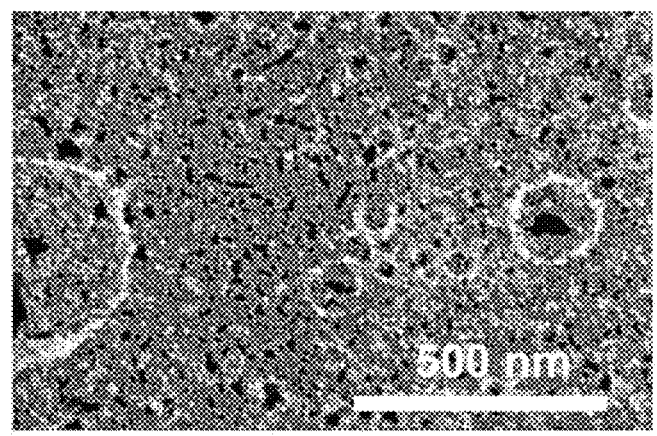
FIG. 14: This is a SEM image of the metal nanoparticle array structure of Example 7.

FIGS. 8 to 10 are SEM images of the metal nanoparticle array structures of Examples 1 to 3. FIG. 14 is a SEM image of the metal nanoparticle array structure of Example 7. Though partly defective, metal nanoparticle arrays of metal nanoparticles arrayed at regular intervals were formed at a high coverage.

FIG. 8 is analyzed. In the metal nanoparticle arrays in Example 1, the particle size Fm of the gold nanoparticles is 9 nm, the particle-to-particle distance Lm between the adjacent metal nanoparticles is 10.6 nm, and the gap distance Gm between the metal nanoparticles is 1.6 nm. The coverage is 58%.

FIG. 9 is analyzed. In the metal nanoparticle arrays in Example 2, the particle size Fm of the gold nanoparticles is 9 nm, the particle-to-particle distance Lm between the adjacent metal nanoparticles is 11.4 nm, and the gap distance Gm between the metal nanoparticles is 2.4 nm. The coverage with the metal nanoparticle arrays is 95% or more. Almost the entire range of the substrate having a size of 15 mm×15 mm attained the coverage.

FIG. 10 is analyzed. In the metal nanoparticle arrays in Example 3, the particle size Fm of the gold nanoparticles is 9 nm, the particle-to-particle distance Lm between the adjacent metal nanoparticles is 11.9 nm, and the gap distance Gm between the metal nanoparticles is 2.9 nm. The coverage is 82%.

FIG. 14 is analyzed. In the metal nanoparticle arrays in Example 7, the particle size Fm of the gold nanoparticles is 9.0 nm, the particle-to-particle distance Lm between the adjacent metal nanoparticles is 11.9 nm, and the gap distance Gm between the metal nanoparticles is 2.9 nm. The coverage is 92%.

All the arrays have a hexagonal closing packed structure as the nearest neighbor structure.

Figure 11:
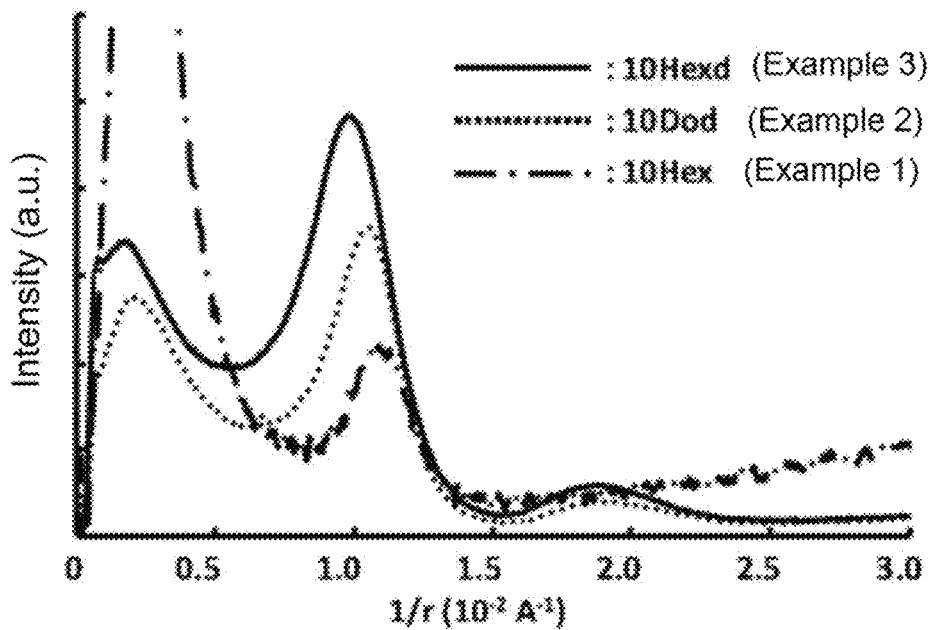
FIG. 11: This shows small-angle scattering spectra of the metal nanoparticle array structures of Examples 1 to 3.
Figure 15:
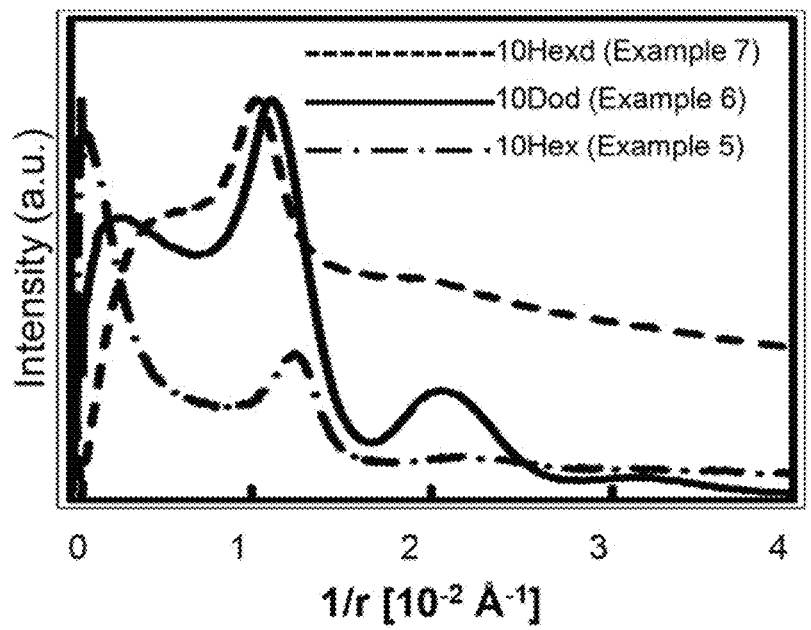
FIG. 15: This shows small-angle scattering spectra of the metal nanoparticle array structures of Examples 5 to 7.
Figure 16:
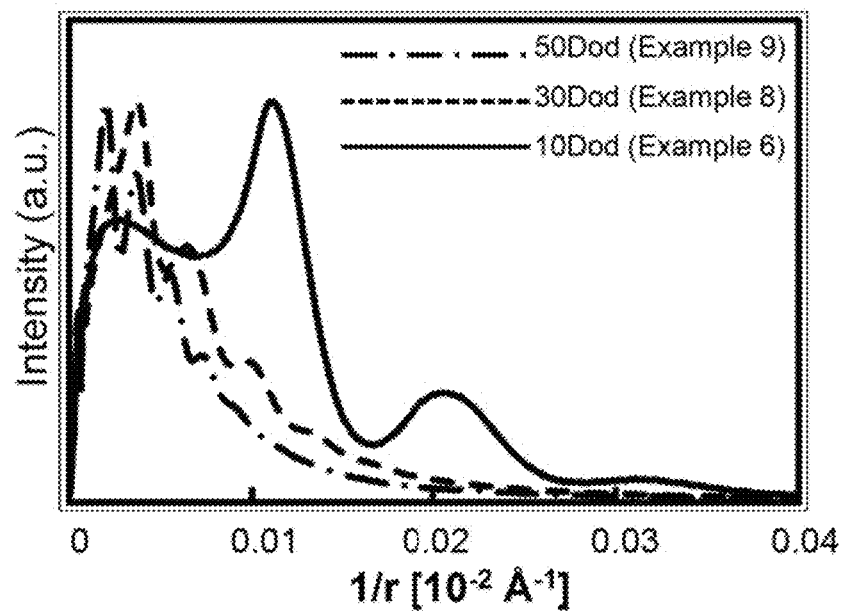
FIG. 16: This shows small-angle scattering spectra of the metal nanoparticle array structures of Example 6, Example 8 and Example 9.

FIG. 11 shows the data of small-angle scattering spectra of the metal nanoparticle array structures of Examples 1 to 3. FIG. 15 shows the data of small-angle scattering spectra of the metal nanoparticle array structures of Examples 5 to 7. FIG. 16 shows the data of small-angle scattering spectra in Example 6, Example 8 and Example 9. Spectral peaks are seen nearly at the same positions in these graphs.

From the results in FIG. 11, it is known that the particle-to-particle distance relative to the hexanethiol molecule, the dodecanethiol molecule and the hexadecanethiol molecule is 10.8 nm, 11.0 nm and 11.8 nm, respectively. The results indicate that when the length of the alkane molecule is larger, then the particle-to-particle distance becomes longer.

From the results in FIG. 15, it is known that the particle-to-particle distance relative to the hexanethiol molecule, the dodecanethiol molecule and the hexadecanethiol molecule is 9.8 nm, 10.7 nm and 11.0 nm, respectively. The results indicate that when the length of the alkane molecule is larger, then the particle-to-particle distance becomes longer.

This means that the gap distance Gm between the adjacent gold nanoparticles can be controlled by selecting the modifying molecule, and in particular, it is verified that the carbon number of the alkanethiol molecule and the gap distance Gm between the adjacent nanoparticles are proportional to each other.

From the results in FIG. 16, it is known that the particle-to-particle distance relative to the particle size Fm of 10 nm, 30 nm and 50 nm is 10.7 nm. 31.4 nm and 50.6 nm, respectively.

This means that the gap distance Gm between the adjacent gold nanoparticles can be controlled by the particle size Fm, as independently validating the results in canning microscopy.

Further, in the case of gold nanoparticle arrays, the frequency of localized plasmon resonance with gold nanoparticles as scatterers can be controlled.

This is because the frequency is defined by the gap distance Gm between the adjacent gold nanoparticles and the particle size Fm of the gold nanoparticles.

Figure 12:
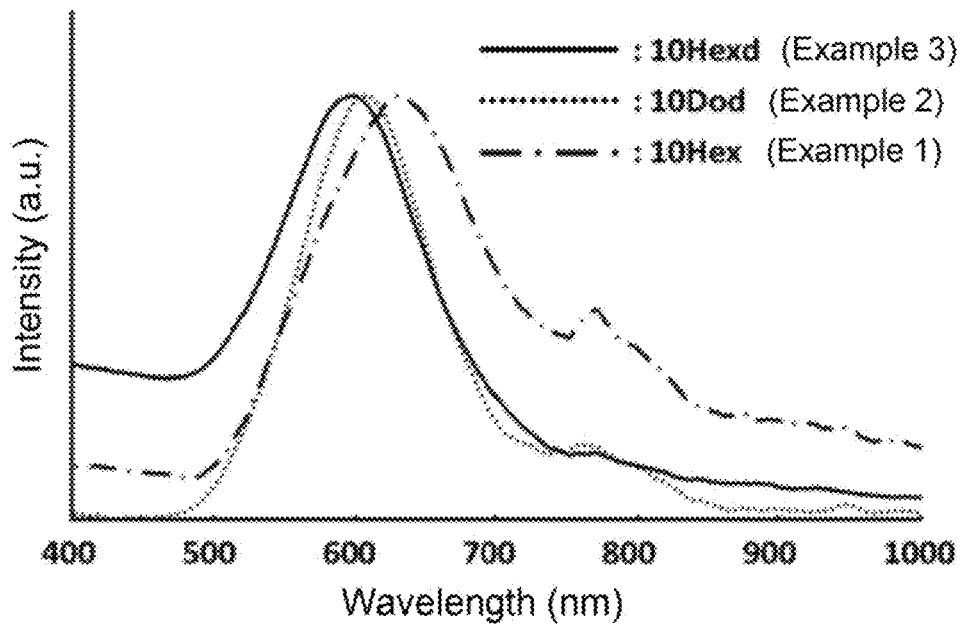
FIG. 12: This shows extinction spectra of the metal nanoparticle array structures of Examples 1 to 3.
Figure 17:
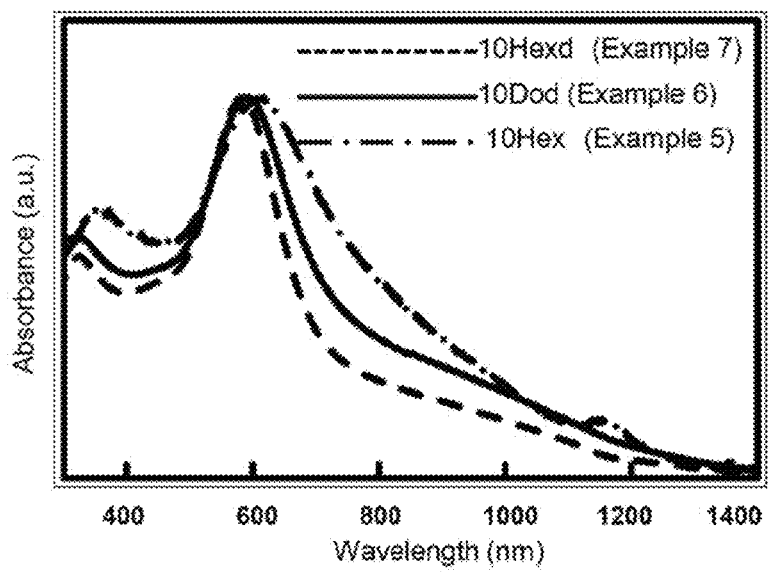
FIG. 17: This shows extinction spectra of the metal nanoparticle array structures of Examples 5 to 7.

FIG. 12 shows the data of extinction spectra of the metal nanoparticle array structures of Examples 1 to 3, and shows the graphs indicating the interparticle gap distance Gm dependence of the frequency in localized plasmon resonance. FIG. 17 shows the data of extinction spectra of the metal nanoparticle array structures of Examples 5 to 7.

As shown in FIG. 12, in case where the interparticle gap distance Gm was varied from 1.6 nm to 3.0 nm while the particle size Fm was kept immobilized to be 10 nm, the frequency peak in localized plasmon resonance changed from 599 nm to 630 nm. However, the change was small, and it is known that the length of the molecular chain of the organic molecule used in the modifying part caused slight red shifting of the extinction peak position.

As shown in FIG. 17, in case where the interparticle gap distance Gm was varied from 1.6 nm to 3.0 nm while the particle size Fm was kept immobilized to be 10 nm, the frequency peak in localized plasmon resonance changed from 582 nm to 615 nm. However, the change was small, and it is known that the length of the molecular chain of the organic molecule used in the modifying part caused slight red shifting of the extinction peak position.

Figure 13:
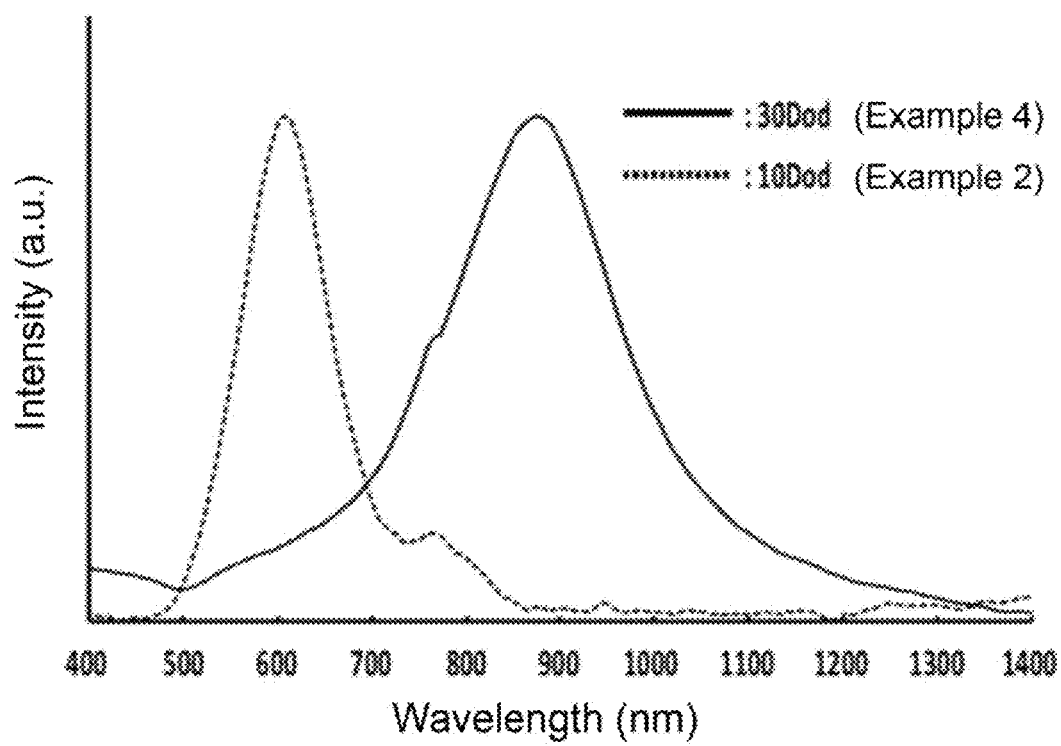
FIG. 13: This shows extinction spectra of the metal nanoparticle array structures of Example 2 and Example 4.
Figure 18:
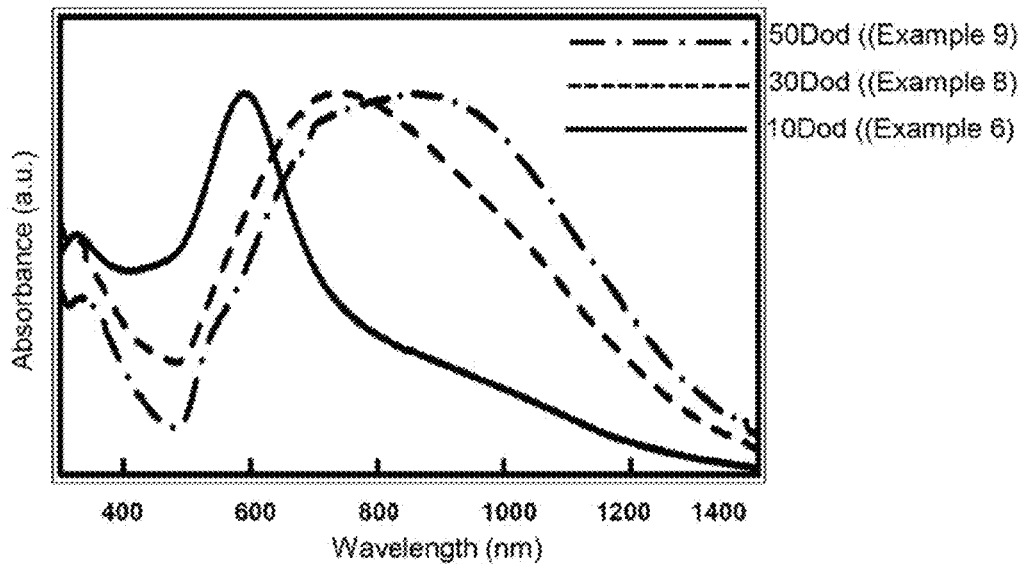
FIG. 18: This shows extinction spectra of the metal nanoparticle array structures of Example 6, Example 8 and Example 9.

FIG. 13 shows the data of extinction spectra of the metal nanoparticle array structures of Examples 2 and 4, and shows the graphs indicating the particle size Fm dependence of the frequency in localized plasmon resonance. FIG. 18 shows the data of extinction spectra of the metal nanoparticle array structures of Example 6, Example 8 and Example 9, and shows the graphs indicating the particle size Fm dependence of the frequency in localized plasmon resonance.

As shown in FIG. 13, in case where the particle size Fm was varied from 10 nm to 50 nm while the interparticle gap distance Gm was kept immobilized, the frequency peak position in localized plasmon resonance changed from 599 nm to 880 nm. In other words, it is known that when the particle size of the metal nanoparticles is enlarged, then the extinction peak greatly shifts in red.

The dependency is suggested also in Non-Patent Reference 19, and was verified in a simplified manner in these Examples.

As shown in FIG. 18, in case where the particle size Fm was varied from 10 nm to 50 nm while the interparticle gap distance Gm was kept immobilized, the frequency peak position in localized plasmon resonance changed from 592 nm to 850 nm. In other words, it is known that when the particle size of the metal nanoparticles is enlarged, then the extinction peak greatly shifts in red.

The mechanical strength between the gold nanoparticles and the electroconductive substrate (gold thin film on glass substrate) through chemical bonding to the electroconductive substrate was confirmed by ultrasonic washing in solvent (24.8 kHz, 5 minutes).

The metal nanoparticle array structure of Comparative Example 1 remained only 18%. On the other hand, the metal nanoparticle array structure of Example 1 remained 71%.

The metal nanoparticle array structure of Example 5 remained 90%.

From the above results, it is known that even on an electroconductive film formed on an insulating substrate, or even on an ITO substrate like a transparent electrode, metal nanoparticle array structures can be formed so far as the substrate has an electroconductive surface.

(Evaluation of Catalytic Effect)

Figure 19:
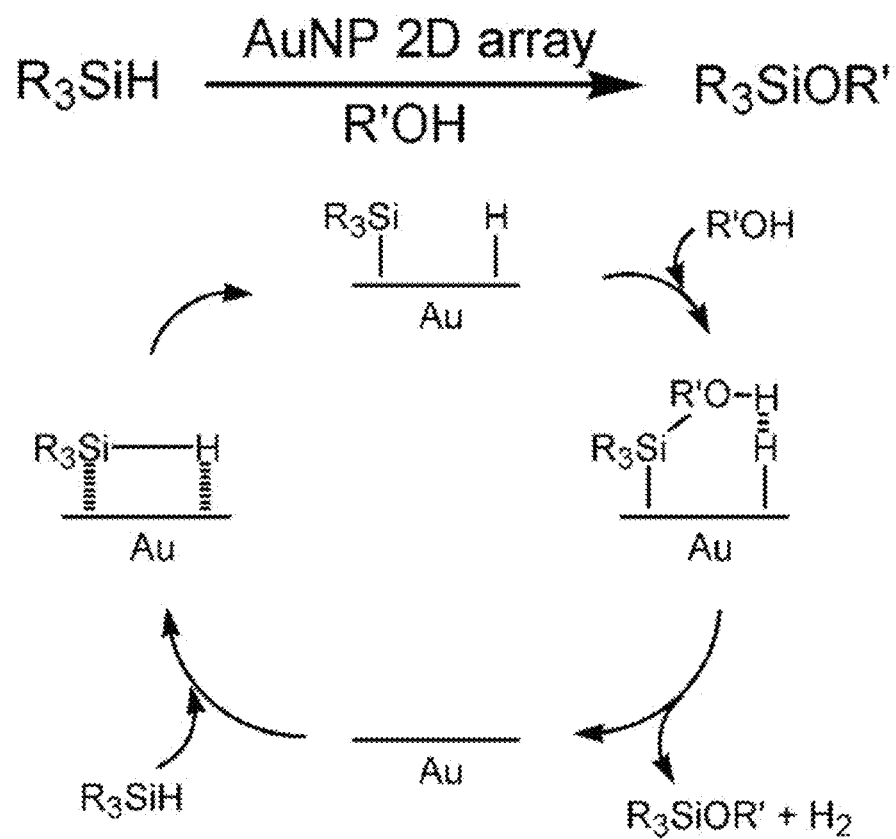
FIG. 19: This shows a catalytic mechanism of dehydrogenating silyletherification of silane and alcohol using the metal nanoparticle arrays of Example 2 as a catalyst.

The catalytic effect of the metal nanoparticle arrays in Example 2 was confirmed in silyletherification of silane and alcohol as shown in FIG. 19.

For the catalytic reaction, the metal nanoparticle arrays of Example 2 were immersed in a solution prepared by dissolving a silane in an alcohol, and the solution was stirred with a stirrer. After a predetermined period of time, the reaction yield of the product was confirmed through gas chromatography.

Figure 20:
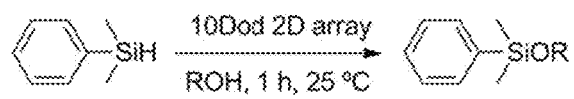
FIG. 20: This shows the alcohol substituent dependence of the silyletherification efficiency of dimethylphenylsilane using the metal nanoparticle arrays of Example 2 as a catalyst.

As shown in FIG. 20, it is known that the nanoparticle arrays exhibit a high catalytic effect for dimethylphenylsilane in a solvent of ethanol, 1-butanol, 1-hexanol, 2-butanol, tert-butanol and benzyl alcohol.

It is known that the reaction for which conventional metal nanoparticles require a high temperature of 100° C. (Non-Patent Reference 20) can efficiently go on under the condition of room temperature with the metal nanoparticle arrays of the invention.

In addition, the fact that the reaction can go on even in tert-butanol in which the reaction could go on little in the presence of conventional metal nanoparticles indicates the high catalytic activity of the metal nanoparticle arrays of the invention.

Further, the catalytic activity varies depending on the length of the substituent in alcohol, and it is known that the alkanethiol molecular layer to cover the metal nanoparticle surface exhibits the function of taking in the alcohol substrate as a hydrophobic reaction space.

Figure 21:
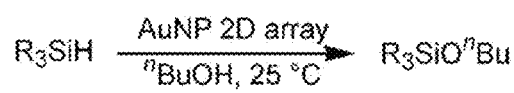
FIG. 21: This shows the silane substituent dependence of the silyletherification efficiency in butanol using the metal nanoparticle arrays of Example 2 as a catalyst.

As shown in FIG. 21, it is known that the nanoparticle arrays of the invention exhibit the catalytic effect for various hydrosilanes such as triphenylsilane, diphenylmethylsilane, dimethylphenylsilane, trihexylsilane and triethylsilane in a solvent 1-butanol.

Triisopropylsilane and tristrimethylsiloxysilane having bulky substituents did not almost undergo reaction, from which it is known that the compounds could be hardly taken in the hydrophobic reaction field to be formed by the alkanethiol.

Silanes having aryl substituents well undergo reaction extremely at high efficiency rather than trialkylsilanes, from which it is known that the hydrophobic reaction space to be formed by the alkanethiol on the metal nanoparticle surface could act significantly for incorporation of aromatic compounds thereinto.

Figure 22:
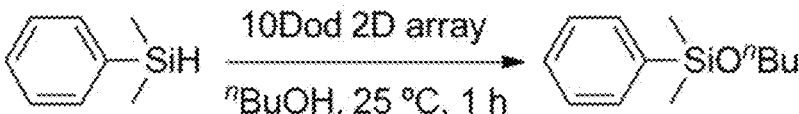
FIG. 22: This shows the repetitive catalyst activity in butyletherification of dimethylphenylsilane using the metal nanoparticle arrays of Example 2 as a catalyst.

As shown in FIG. 22, the catalytic activity of the catalyst does not lower even after repeated use thereof. It is known that in use for a total of 6 times, nearly the same catalytic activity was kept.

Figure 23:
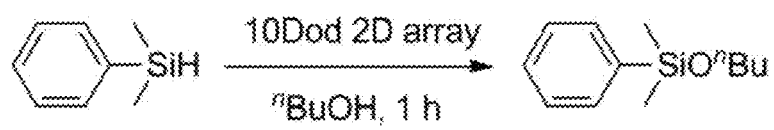
FIG. 23: This shows the temperature dependence in butyletherification of dimethylphenylsilane using the metal nanoparticle arrays of Example 2 as a catalyst.
Figure 23:
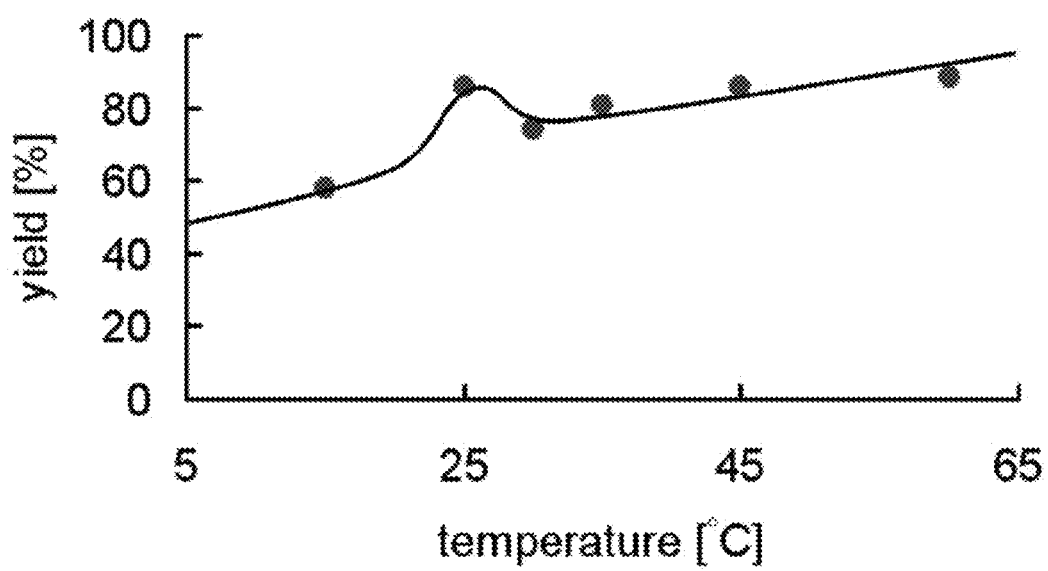

FIG. 23 shows the temperature dependence of the catalytic activity for dimethylphenylsilane in a solvent 1-butanol. The temperature dependence is such that the catalytic activity peak is at around 25° C., from which it is considered that dimethylphenylsilane could be taken in the hydrophobic space formed by the alkyl groups in the modifying molecules for the metal nanoparticles. Accordingly, the metal nanoparticles exhibit high catalytic activity even at low temperatures of 25° C. or so.

INDUSTRIAL APPLICABILITY

In the metal nanoparticle array structure of the invention, the localized surface plasmon provides reinforcing interaction between the metal nanoparticles closely arrayed at intervals of a few nanometers, whereby the structure surface can generate an extremely strong electromagnetic field. The plasmon coupling phenomenon readily occurs through ordinary photoirradiation, and therefore the array structure of the invention is applicable to light waveguides, photochemical reactors, optical devices, highly-sensitive sensors, catalysts, etc. In addition, the metal nanoparticle array structure of the invention can readily change the wavelength for the localized plasmon thereof by changing the size of the metal nanoparticles therein and the alkyl chain length of the surface modifying molecules therein, and therefore, various types of structures can be constructed herein in accordance with the intended objects. The hydrophobic space formed by the alkanethiol on the metal nanoparticle surface has the function of taking organic molecules therein, and therefore, by changing the alkyl chain length of the surface modifying molecules, the substrate taking-in capability of the array structure can be controlled. Consequently, the array structure of the invention can be used as a catalyst and a highly-sensitive sensor, utilizing the characteristics of the hydrophobic space and the metal nanoparticles therein. Further, in the invention, the metal nanoparticle array structure can be formed in a large area at a high coverage, and therefore, different from conventional metal nanoparticle arrays limited in a micro area, the array structure of the invention can provide various devices of various sizes suitable to human real life.

The invention claimed is:

1. A metal nanoparticle array structure comprising:
a substrate,
an immobilizing layer formed on one surface of the substrate, and
metal nanoparticle arrays formed on one surface of the immobilizing layer, wherein:
the metal nanoparticle arrays are so arrayed that multiple metal nanoparticles are at regular intervals,
the metal nanoparticles are bonded to each other via a modifying part arranged on a surface thereof, and the modifying part comprises an organic molecule having a thiol group,
the immobilizing layer comprises an organic molecule having at least one thiol group, and the thiol group is arranged on one surface of the immobilizing layer, and
the metal nanoparticles are immobilized on the one surface of the immobilizing layer via chemical bonds of the thiol groups of the immobilizing layer.

2. The metal nanoparticle array structure as claimed in claim 1, wherein a gap distance between the metal nanoparticles is from 1 to 10 nm.

3. The metal nanoparticle array structure as claimed in claim 1, wherein a particle size of the metal nanoparticles is from 1 to 100 nm.

4. The metal nanoparticle array structure as claimed in claim 1, wherein the metal nanoparticles are formed of gold.

5. The metal nanoparticle array structure as claimed in claim 1, wherein the organic molecule of the modifying part has an alkyl chain with from 6 to 20 carbon atoms.

6. The metal nanoparticle array structure as claimed in claim 1, wherein the immobilizing layer comprises an organic molecule having at least two thiol groups, at least one thiol group is arranged on both one surface and the other surface of the immobilizing layer, and the thiol group on the other surface is bonded to the substrate.

7. The metal nanoparticle array structure as claimed in claim 6, wherein the organic molecule to constitute the immobilizing layer has an alkyl chain with from 6 to 20 carbon atoms.

8. The metal nanoparticle array structure as claimed in claim 1, wherein the substrate is an electroconductive substrate.

9. The metal nanoparticle array structure as claimed in claim 1, wherein the substrate comprises an insulating substrate having an electroconductive thin film formed on one surface thereof.

* * * * *